United States Patent [19]

Eastman et al.

[11] Patent Number: 5,629,921
[45] Date of Patent: May 13, 1997

[54] LEVEL DETECTOR FOR DETECTING A VOLTAGE LEVEL OF A SIGNAL

[75] Inventors: Clarke K. Eastman; Jeffrey T. Klaus, both of Rochester, N.Y.

[73] Assignee: Eastman Kodak Company, Rochester, N.Y.

[21] Appl. No.: 484,273

[22] Filed: Jun. 7, 1995

Related U.S. Application Data

[62] Division of Ser. No. 179,472, Jan. 10, 1994, abandoned.

[51] Int. Cl.$^6$ .................................................. G11B 7/00
[52] U.S. Cl. ................................................. 369/124; 369/54
[58] Field of Search ........................................ 369/54, 53, 58, 369/59, 60, 42, 48, 44.34, 44.41, 116, 124

[56] References Cited

U.S. PATENT DOCUMENTS

| | | |
|---|---|---|
| 4,145,758 | 3/1979 | Drexler et al. . |
| 4,283,785 | 8/1981 | Miyauchi et al. . |
| 4,308,612 | 12/1981 | Miyauchi et al. . |
| 4,363,116 | 12/1982 | Kleuters et al. . |
| 4,426,694 | 1/1984 | Kimura . |
| 4,558,441 | 12/1985 | Yokota et al. . |
| 4,562,567 | 12/1985 | Frankfort et al. . |
| 4,621,352 | 11/1986 | Kato . |
| 4,648,085 | 3/1987 | Shimonou . |
| 4,651,314 | 3/1987 | Yoshikawa et al. . |
| 4,656,618 | 4/1987 | Kaku et al. . |
| 4,669,072 | 5/1987 | Miura et al. . |
| 4,680,594 | 7/1987 | Bracht . |
| 4,701,603 | 10/1987 | Dakin et al. . |
| 4,719,612 | 1/1988 | Kenjyo . |
| 4,727,531 | 2/1988 | Ito et al. . |
| 4,730,290 | 3/1988 | Takasago et al. . |
| 4,761,776 | 8/1988 | Opheij . |
| 4,789,974 | 12/1988 | Satoh et al. . |
| 4,797,866 | 1/1989 | Yoshikawa . |
| 4,799,210 | 1/1989 | Wilson et al. . |
| 4,800,548 | 1/1989 | Koishi et al. . |
| 4,811,329 | 3/1989 | Shikama et al. . |
| 4,829,505 | 5/1989 | Boyd et al. . |
| 4,866,689 | 9/1989 | Satokata . |
| 4,866,692 | 9/1989 | Saito et al. . |
| 4,879,703 | 11/1989 | Kaku et al. . |
| 4,908,815 | 3/1990 | Gregg et al. . |
| 4,941,139 | 7/1990 | Kulakowski et al. . |
| 4,956,832 | 9/1990 | Miyasaka . |
| 4,985,880 | 1/1991 | Yoshida et al. . |

(List continued on next page.)

OTHER PUBLICATIONS

Philips CDD521 Professional Compact Disc Recorder Service Manual, published by Service & Support Interactive Media Systems, Netherlands.

*Primary Examiner*—Muhammad N. Edun
*Attorney, Agent, or Firm*—Raymond L. Owens

[57] ABSTRACT

A level detector for detecting a voltage level of a signal, is disclosed. The level detector includes a signal comparator having a first input for receiving the signal; a first switch responsive to an output of the signal comparator to connect a first current source to an output of the detector. The first current source connected between a first voltage reference and the first switch, the detector output feeding back to a second input of the signal comparator, such that the first current source supplies current to the detector output until a voltage at the detector output is greater than the voltage level of the signal. The level detector further includes a reference pulse input for receiving a reference pulse having a predetermined time duration; a second switch responsive to the reference pulse to connect a second current source to the detector output, the second current source connected between a second voltage reference and the second switch, such that the second current source supplies current to the detector output for a period of time substantially equivalent to the predetermined reference pulse duration; and an energy storage structure connected between the detector output and a constant voltage potential of the detector, such that the output voltage of the detector varies in response to current supplied to the detector output from the first and the second current sources.

3 Claims, 16 Drawing Sheets

U.S. PATENT DOCUMENTS

| | | |
|---|---|---|
| 5,007,039 | 4/1991 | Sakemoto et al. . |
| 5,018,126 | 5/1991 | Kulakowski et al. . |
| 5,020,040 | 5/1991 | Lee . |
| 5,023,857 | 6/1991 | Verboom . |
| 5,042,020 | 8/1991 | Endo . |
| 5,042,021 | 8/1991 | Nagano et al. . |
| 5,042,023 | 8/1991 | Yokota . |
| 5,077,714 | 12/1991 | Katayama et al. . |
| 5,079,757 | 1/1992 | Wachi et al. . |
| 5,101,396 | 3/1992 | Takeuchi et al. . |
| 5,105,409 | 4/1992 | Kaku et al. . |
| 5,115,421 | 5/1992 | Rokutan . |
| 5,115,423 | 5/1992 | Maeda et al. . |
| 5,119,355 | 6/1992 | Yamamoto et al. . |
| 5,126,993 | 6/1992 | Yokota . |
| 5,126,994 | 6/1992 | Ogawa et al. ............................ 369/116 |
| 5,142,514 | 8/1992 | Verboom et al. . |
| 5,148,420 | 9/1992 | Yamamuro . |
| 5,151,888 | 9/1992 | Shikichi et al. . |
| 5,155,716 | 10/1992 | Imanaka et al. . |
| 5,161,144 | 11/1992 | Takeuchi et al. . |
| 5,172,352 | 12/1992 | Kobayashi . |
| 5,189,655 | 2/1993 | Ogata et al. . |
| 5,200,946 | 4/1993 | Fritz . |
| 5,260,917 | 11/1993 | Mashimo ............................. 369/124 X |
| 5,295,129 | 3/1994 | Lee ...................................... 369/124 X |
| 5,309,425 | 5/1994 | Yamamuro et al. ..................... 369/124 |
| 5,311,493 | 5/1994 | Fuji ..................................... 369/124 X |
| 5,491,681 | 2/1996 | Klein et al. ............................ 369/124 |

LEVEL DETECTOR FOR DETECTING A VOLTAGE LEVEL OF A SIGNAL

This is a Divisional of application Ser. No. U.S. Pat. No. 179,472, filed 10 Jan. 1994 abandoned.

CROSS REFERENCE TO RELATED APPLICATIONS

The present invention is related to the following U.S. patent applications: "Laser Power Control In An Optical Recording System Using Partial Correction Of Reflected Signal Error", Ser. No. 08/179,476, filed Jan. 10, 1994, now U.S. Pat. No. 5,436,880, issued Jul. 25, 1995; "Laser Power Control To Compensate For Multiple System Degradations", Ser. No. 08/179,394 filed Jan. 10, 1994, now U.S. Pat. No. 5,446,716, issued Aug. 29, 1995; "Method And Apparatus For Focusing A Recording Light Beam On A Recording Medium", Ser. No. 08/179,477, filed Jan. 10, 1994, now U.S. Pat. No. 5,561,645, issued Oct. 1, 1996; and "Method and Apparatus for Maintaining A Recording Light Beam In An On-track Position On A Recording Medium", Ser. No. 08/179,474, filed Jan. 10, 1994, now U.S. Pat. No. 5,440,534, issued Aug. 8, 1995; assigned to the assignee of the present invention, the disclosures of which are incorporated herein by reference.

1. Field of the Invention

The present invention relates to optical data recording. More particularly, the present invention relates to an improved optical recording system and method which verifies recorded data as it is being written onto an optical recording medium.

2. Description of the Prior Art

In recording data on an optical medium, there are many potential problems with, for example, the recording hardware or the optical medium itself which could result in erroneous data recording. It is therefore often desirable to verify that the data has been correctly recorded. Data verification may be performed using a "two-pass" approach, in which a first pass over the recording medium writes the data, and a second reads the recorded data. If the data is recovered with an acceptable error rate, proper recording has been verified. However, in systems with a single optical scanning beam to write and read the data, use of the two-pass approach effectively doubles the amount of time required to write a given quantity of data onto the medium. In systems which utilize a second optical scanning beam to read the data after it is written, often referred to as direct read after write (DRAW) systems, the time required to write and verify the data is reduced, but additional hardware is needed to provide the second optical beam.

Alternative verification techniques have been developed which avoid the need to subsequently read the recorded data. One such technique, known as direct read during write (DRDW), monitors changes in reflectivity of the optical medium during recording. Data is generally recorded on an optical medium, such as a recordable compact disk (CD), in the form of marks. A mark, also known as a pit, has a different reflectivity than the unmarked portions of the disk, or lands, and is formed using a write signal power level sufficient to alter the reflectivity of the medium. The marks and lands represent different binary logic levels within the recording data. DRDW systems typically monitor a reflected write signal while a mark is being written on the medium. The reflected write signal can be analyzed to determine whether or not the mark has been properly formed, or, in other words, whether the data has been properly recorded on the medium.

Currently available DRDW verification techniques, however, suffer from a number of significant drawbacks. For example, a DRDW technique used in the CDD521 optical disk writer, manufactured by Phillips Corporation, uses a forward sense diode in the optical recording head while generating a measure of mark formation effectiveness, and is therefore sensitive to the magnitude of the reflected signal. The forward sense diode monitors the incident optical signal level. A variety of effects, unrelated to proper mark formation, can alter the amount of reflected light received relative to the incident light and thereby reduce the effectiveness of the CDD521 DRDW technique as an indicator of proper mark formation. These effects include, for example, optical source wavelength variation combined with an optical medium in which reflectivity varies with wavelength, variations in optical disk substrate birefringence, and media imperfections or contaminations such as dust, fingerprints and scratches.

Another prior art DRDW technique is disclosed in U.S. Pat. No. 5,126,994, assigned to Sony Corporation. The Sony technique involves sampling a reflected write pulse at two points in time, once during a period of constant maximum reflected signal power before a mark begins to form, and then after the mark formation process has reached a steady state. The ratio of the two measured levels is used to indicate whether the mark has been properly formed. The Sony technique may be acceptable for certain types of optical media, such as metallic or phase-change media, in which there is an initial period of constant reflected signal power before a mark begins to form. However, for media in which the reflectivity changes rapidly after the onset of a write pulse, such as the absorptive dye-based media used in many recordable CDs, it may be difficult to accurately sample the maximum reflected signal power. Examples of absorptive dye-based optical media which do not exhibit an initial plateau of constant reflectivity include recordable CD media from Kodak and Taiyo Yuden Corporation.

The accuracy of the above-described CDD521 and Sony DRDW techniques depends on precisely sampling the reflected write signal at one or more predetermined times after a rising edge of the reflected pulse. Certain aspects of the sample timing, such as the propagation delay of the sampling pulse relative to the reflected pulse, change as a result of variation in circuit components over time or temperature. It may then become very difficult to properly monitor the reflected write pulses. For example, the sample timing may shift such that the reflected signal is sampled before or after, rather than during, a reflected write pulse. Even without component variation, it may be difficult to set the system timing because the arrival time of the reflected write pulse often cannot be accurately predicted. DRDW systems which rely on precise sample timing to monitor the reflected signal may therefore require additional hardware to synchronize the rising edge of a reflected write pulse and the sampling pulse or pulses.

Existing DRDW techniques are also sensitive to write speed. The CDD521, for example, operates at a write speed of about 2x, which corresponds to two times the standard 4.32 Mbits/sec playback speed for an audio CD. As recording system speed is increased beyond 2x, the above-described problems may become more severe, and in effect limit the maximum write speed at which mark formation can be accurately verified. For example, as the system speed increases, the reflected write pulses become narrower and more difficult to accurately sample. A given amount of variation in sample timing may therefore produce a greater error in the reflected pulse measurement.

As is apparent from the above, existing DRDW write verification techniques are generally overly sensitive to reflected signal magnitude, media type, sample timing, and write speed, as well as other system parameters, and therefore the effectiveness of the techniques as an indication of proper mark formation is limited.

SUMMARY OF THE INVENTION

The present invention provides an apparatus and method for verifying data as it is written on an optical medium, which are generally less sensitive to reflected signal magnitude, type and condition of the optical medium, sample timing, system write speed, and other recording system parameters. The recording system of the present invention provides improved write verification in part by generating a mark formation effectiveness (MFE) signal which corresponds to a rate of change of the reflected write pulse as a mark is being formed, normalized to the magnitude of the reflected pulse.

In accordance with one aspect of the present invention, an optical recording system is provided which includes an optical source for supplying an incident write signal to an optical recording medium. This write signal is intensity-modulated by recording data, and has at least one write pulse. The write signal records a logic level of the data on the medium during the write pulse as a mark having a distinct reflectivity. An optical detector detects a reflection of the incident write signal from the medium to provide an electrical reflected write signal which includes a reflected write pulse corresponding to the incident write pulse. The reflected write pulse varies with time, and has a rate of change resulting from a change in reflectivity of the optical medium as the mark is formed thereon. An MFE signal generator receives the reflected write signal and generates an MFE signal that varies with the normalized rate of change of the reflected pulse, to provide an indication of mark formation quality.

In accordance with another aspect of the present invention, the optical recording system may include comparison means for verifying that the data has been properly recorded on the optical medium by determining if the MFE signal is within a predetermined range of acceptable reflected pulse rates of change. For "burn dark" types of optical recording media, in which marks are areas of reduced reflectivity, the voltage level of the reflected write pulse decreases as a function of time, from a first voltage to a second voltage, during formation of the mark. From the first to the second voltage, the decay of the reflected write pulse is substantially exponential. The MFE signal, which varies with the decay rate, may be a quotient of the first and second voltages, a linear or non-linear transformation of the quotient, or another suitable estimate of the reflected pulse decay rate.

ADVANTAGES

As a feature of the present invention, proper mark formation can be verified without unduly limiting system parameters such as the media type or write speed. For example, the present invention is suitable for verifying proper mark formation on absorptive dye-based recordable optical media at system write speeds of 6× or higher.

As another feature of the present invention, generating accurate MFE signals requires less timing precision than existing DRDW systems. For example, in one embodiment of the present invention, the start of a sample pulse may occur before or after the reflected pulse peak with much less error in the resulting voltage level measurements than would occur with prior art techniques.

Further features of the invention, its nature and various advantages will become more apparent from the accompanying drawings and following detailed description of the invention.

DETAILED DESCRIPTION OF THE PREFERRED EMBODIMENTS

Figure 1:
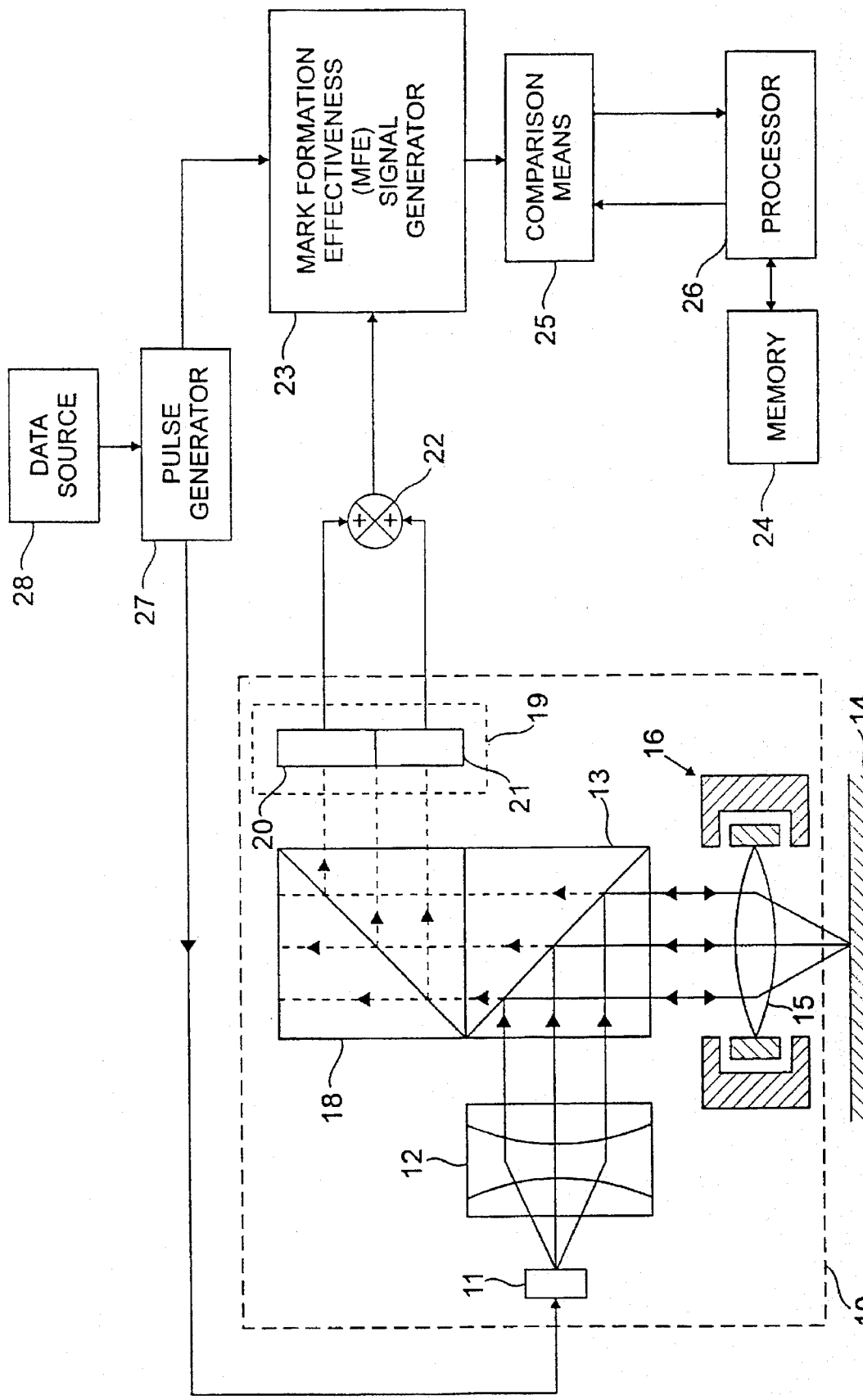
FIG. 1 is a block diagram of an exemplary optical recording system in accordance with the present invention.

FIG. 1 is a block diagram of an exemplary optical recording system in accordance with the present invention. The recording system includes an optical head 10 for supplying an incident optical write signal used to record data on an optical recording medium 14. The optical head 10 includes an optical source 11 for generating the incident write signal. The optical source 11 may include, for example, a laser diode and a controller, and may be referred to herein simply as a laser. It should be understood, however, that the techniques of the present invention may be used with many other types of optical sources. The optical source 11 may be intensity-modulated by a stream of recording data such as digital audio, video, or any other information suitably encoded to facilitate recording on the optical medium. An exemplary data encoding technique well-known in the art is the eight-to-fourteen bit modulation (EFM) code used in CD recording. The optical write signal from source 11 passes through beam shaping optics 12 and then through a first beam splitter 13. The beam splitter 13 reflects the optical signal toward the optical recording medium 14 through a focusing lens 15. The optical medium 14 may be a recordable optical CD or any other suitable optical recording medium. The focusing lens 15 is mounted within an actuator 16 such that the lens position may be adjusted in response to focus and tracking error signals using any of a number of well-known techniques.

The optical write signal incident on the optical medium 14 is reflected from the medium back through the focusing lens 15 and the first beam splitter 13. A second beam splitter 18 directs part of the reflected optical write signal toward an optical detector 19. The reflected optical write signal may also be directed, via beam splitter 18, to additional optical detectors, not shown, which may drive, for example, focussing or tracking adjustment circuitry. The optical detector 19 may include a number of photodetectors 20, 21 for detecting the reflected optical signal and generating electrical signals therefrom. Exemplary photodetectors suitable for use in the present invention include positive-intrinsic-negative (PIN) photodiodes and avalanche photodiodes. In systems operating at high write speeds, such as 6× or higher, the photodetectors 20, 21 may require response times on the order of several nanoseconds.

The electrical signals at the output of the photodetectors 20, 21 track the intensity modulation on the reflected optical write signal.

The electrical signals generated by the photodetectors 20, 21 are summed in a signal combiner 22 to produce a reflected write signal which may be processed in subsequent electronic circuitry. The term "reflected write signal" as used herein will generally refer to the electrical signal at the output of the signal combiner 22, rather than the optical signal at the input of optical detector 19. The reflected write signal includes at least one reflected write pulse, corresponding to an incident pulse in the incident optical write signal. In the embodiment of FIG. 1, the use of two photodetectors 20, 21 facilitates generation of a tracking signal. A suitable tracking signal may be generated by, for example, taking the difference between the two photodetector outputs. In other embodiments, a single photodetector could be used within the optical detector 19, and the signal combiner 22 could be eliminated.

A mark formation effectiveness (MFE) signal generator 23 receives the reflected write signal from signal combiner 22 and generates MFE signals which are estimates of the rate of change of reflected write pulse waveforms which make up the reflected write signal. As used herein, the term "rate of change" refers generally to the change in reflected write pulse voltage as a function of time. The term "decay rate" will be used herein to refer to a rate of change, characteristic of certain types of optical media, in which the reflected write pulse voltage decays from a peak value to a lower value, such as a steady-state plateau, during mark formation. The decay rate of the reflected write pulse during mark formation is used in the present invention to provide an indication of the quality of mark formation on the medium, in a manner to be described in greater detail below. The MFE signal output of the signal generator 23 is supplied to a comparison means 25 for verifying that data has been properly recorded on the optical medium by, for example, determining if the MFE signal is within a predetermined range stored in a recording system memory 24. The storage and retrieval of MFE signal values in memory 24 may be controlled by a recording system processor 26.

An exemplary embodiment of the comparison means 25 may include two comparators for comparing an MFE signal to the lowest and highest acceptable decay rate values in the predetermined range. The decay rate values stored in memory 24 are converted to voltages using digital-to-analog converters, and then supplied to the appropriate comparators. The comparators within comparison means 25 could be designed, in a known manner, to generate an error indicator when the MFE signal is not within the acceptable decay rate value range. For example, an error indicator could be generated for a series of reflected write pulses having MFE signal values corresponding to improper mark formation. The error indicator is supplied to system processor 26 and may be used to alert the system that the data should, for example, be read for further verification or be re-written.

A pulse generator 27 receives a stream of data from a data source 28 and supplies suitably encoded recording data, in the form of a stream of write pulses, to optical source 11. The pulse generator 27 also provides reference pulses to the MFE signal generator 23. The MFE signal generator uses these reference pulses to generate an estimate of the normalized reflected write pulse decay rate, in a manner to be discussed in greater detail below. The pulse generator 27 thus serves both as an interface between the data source 28 and the optical source 11, and as a reference pulse source for the MFE signal generator 23. In other embodiments, the data source 28 could directly drive the optical source 11, and the reference pulse generation function could be included within the MFE signal generator 23.

Figure 2:
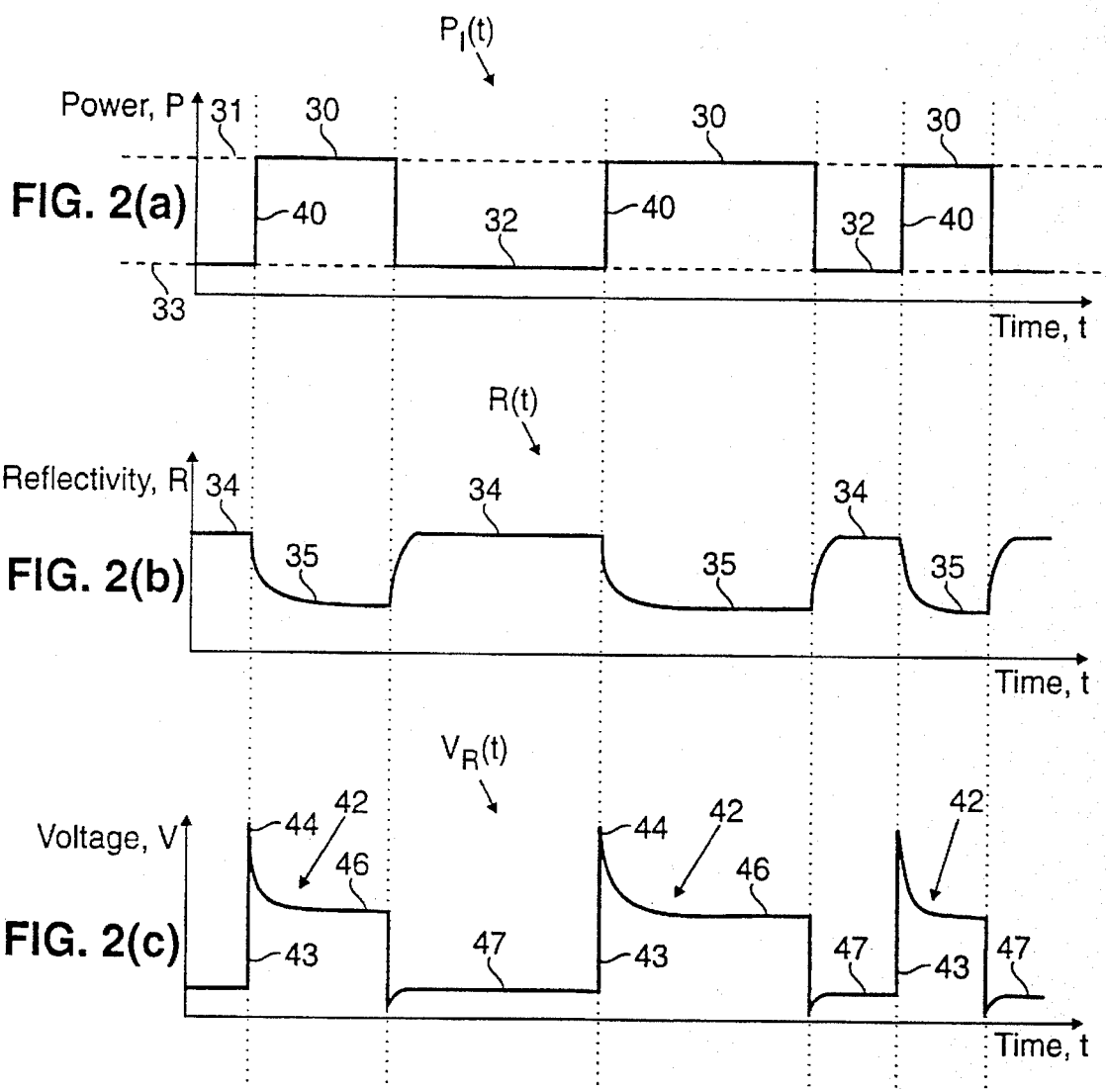
FIG. 2(a) shows an exemplary optical write signal, including several write pulses, illustrative of typical write pulses which will be incident on an optical recording medium during writing.
FIG. 2(b) shows exemplary changes in reflectivity of an optical recording medium in response to the incident write signal of FIG. 2(a).
FIG. 2(c) shows exemplary changes in a reflected write signal, reflected from an optical recording medium with the reflectivity shown in FIG. 2(b).

FIG. 2(a) shows a graph of power, P, versus time, t, for an exemplary incident optical write signal waveform $P_I(t)$. The signal $P_I(t)$ is typical of the signals which may be generated by the optical source 11 and which will be incident on the recording medium 14 during writing. The incident optical write signal $P_I(t)$ includes a number of write pulses 30 at a write power level 31. In this embodiment, in which marks represent areas of reduced reflectivity, the write power level 31 is a power level sufficient to raise the temperature of the optical recording medium 14 such that marks are formed thereon during the write pulses 30. The write pulses 30 correspond to a high logic level of the recording data which intensity-modulates the optical source 11. The write signal also includes a number of intervals 32 at a lower power level 33, corresponding to a low logic level of the recording data. The lower power level 33 is a power level which is not sufficient to alter the reflectivity of the medium, and may suitably be a read power level such that, for example, focus error, tracking error and high-frequency wobble information can be read from the medium during the intervals 32. In other embodiments, the optical source could be turned off between write pulses, such that the lower power level 33 is a zero light intensity level.

FIG. 2(b) shows a waveform, R(t), which illustrates the changes in reflectivity of an optical recording medium as a function of time, resulting from writing on the medium with the incident optical write signal $P_I(t)$ of FIG. 2(a). The changes in the waveform R(t) illustrate the response of a "burn dark" optical recording medium, in which a mark is an area of reduced reflectivity. The medium reflectivity declines from a high reflectivity value 34 to a low reflectivity value 35 during the course of a write pulse 30. The reflectivity declines in this manner due to, for example, the recording medium temperature increase and resultant marking of the medium caused by an incident write pulse 30.

The changes in medium reflectivity shown in FIG. 2(b) produce the exemplary reflected write signal $V_R(t)$ of FIG. 2(c). The reflected write signal $V_R(t)$ includes a number of reflected write pulses 42, generally corresponding to the incident write pulses 30 in FIG. 2(a). The exemplary reflected pulses 42 within the reflected write signal of FIG. 2(c) are characteristic of certain types of optical media. For example, an absorptive dye-based optical recording medium will reflect write pulses similar to the reflected pulses 42 in response to the incident write signal of FIG. 2(a). The voltage level of each reflected write pulse 42 declines from a peak voltage 44 coinciding with the rising edge 40 of the incident write pulse 30, to a steady-state plateau voltage 46 after the onset of mark formation. The reflected write pulses 42 each include a rising edge 43. Although the pulses 42 are shown in FIG. 2(c) as having a sharp, instantaneous rising edge for illustrative purposes, it should be understood that actual reflected pulses may have a more gradual rising edge. An advantage of the level detector circuit of the present invention is its relative insensitivity to characteristics of the reflected pulse rising edge.

One embodiment of the present invention utilizes the decay rate of the reflected write pulse, from a first voltage at or below the peak voltage 44 to a second voltage which may exceed the plateau voltage 46, to indicate proper formation of a mark on the optical medium. Although the reflected pulse is generally illustrated herein as a voltage function, the reflected pulse could also be shown in terms of other parameters, such as current, power or intensity.

To summarize, at the rising edge 40 of the incident pulse 30, the reflectivity of the medium 14 remains high before the onset of mark formation, and therefore the reflected pulse voltage 44 is at a maximum. As the incident pulse 30 begins to reduce the reflectivity of the medium during the onset of mark formation, the magnitude of the reflected write pulse declines toward the lower plateau voltage 46. During the time intervals 32 in which the incident write signal is at the lower power level 33, the reflected write signal is also at a lower level 47.

Figure 3:
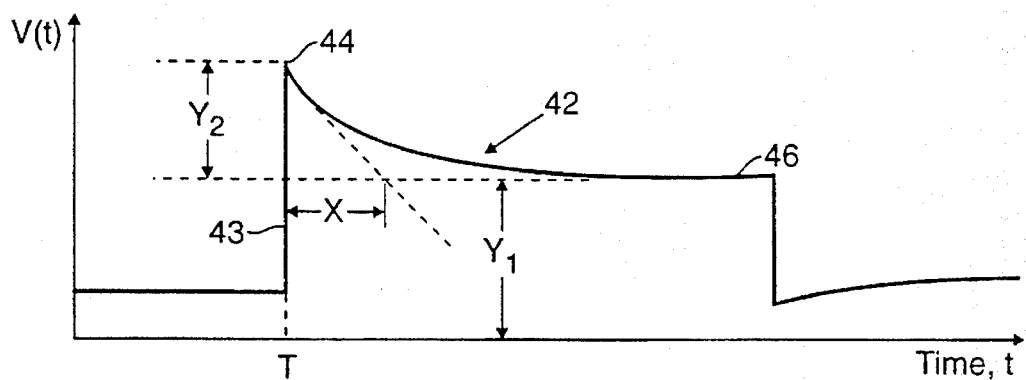
FIG. 3 shows the decaying portion of a reflected pulse and illustrates how that decay may be estimated as an exponential function.

FIG. 3 shows a single reflected write pulse 42 in greater detail. In general, the rate of change of each of the reflected write pulses 42 may be estimated using an exponential function, as shown in FIG. 3. The exemplary exponential function in FIG. 3 represents the decaying portion of one of the reflected write pulses 42 in terms of voltage as a function of time. The exponential function may be expressed as:

$$V_P(t) = Y_1 + Y_2(\exp(-(t-T)/X)).$$

In the above exponential function, t is time, $V_P(t)$ is the reflected pulse voltage, $Y_1$ is the steady-state plateau voltage 46, $Y_2$ is the voltage difference between the peak voltage 44 and the steady-state plateau voltage 46, T is the arrival time of the rising edge, and X is the difference between the time T and the time at which a line tangential to the initial rate of decay crosses the plateau voltage level. The exponential function may be used, in accordance with the present invention, to estimate the decay rate of the reflected write pulses.

Figure 4A:
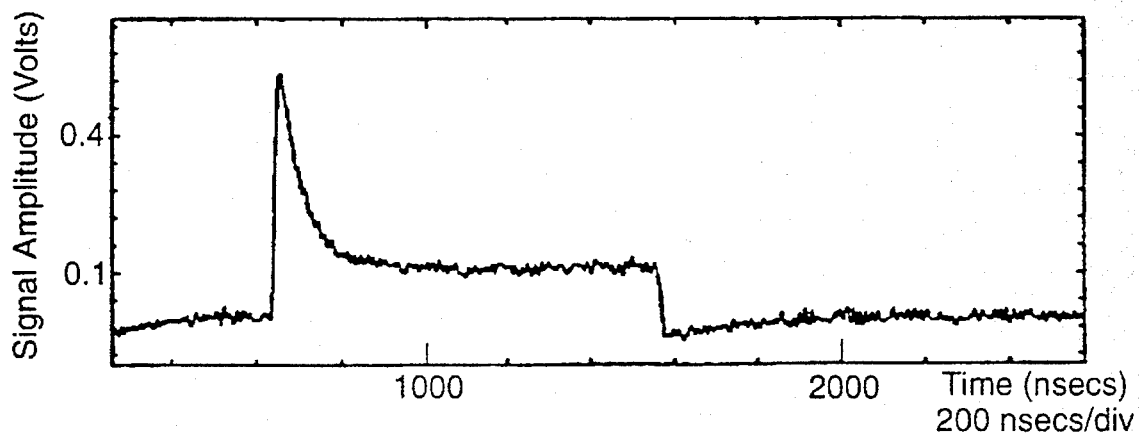
FIG. 4(a) shows an exemplary reflected pulse in a system operating at a 2× write speed.

FIGS. 4 and 5 show measurements of actual reflected write pulses along with corresponding exponential function estimates. FIG. 4(a) is a plot of a reflected write pulse measured in a recording system operating at a write speed of 2×. The reflected write pulse is measured at an optimal incident write power level using a write strategy commonly referred to as "(N−1)T". In general, many different types of intensity-versus-time write signal waveforms could be used to form marks on an optical medium. The term "write strategy" refers to the type of waveforms used to form a given set of marks. The choice of write strategy for a particular recording system will typically depend on a number of factors, including, for example, the type of optical media, the write speed, and the data encoding scheme. In the write strategy known as "NT", the incident pulses are the same length as the desired playback pulses. T refers to a base unit of time, and pulses may have a duration of, for example, 3 to 11 times the base unit T. It should be noted, however, that the incident write pulse need not have the same duration as the desired playback pulse in order to produce a mark of a given length. In an (N−1)T write strategy, each incident pulse is one base time T shorter than the desired playback pulse.

Figure 4B:
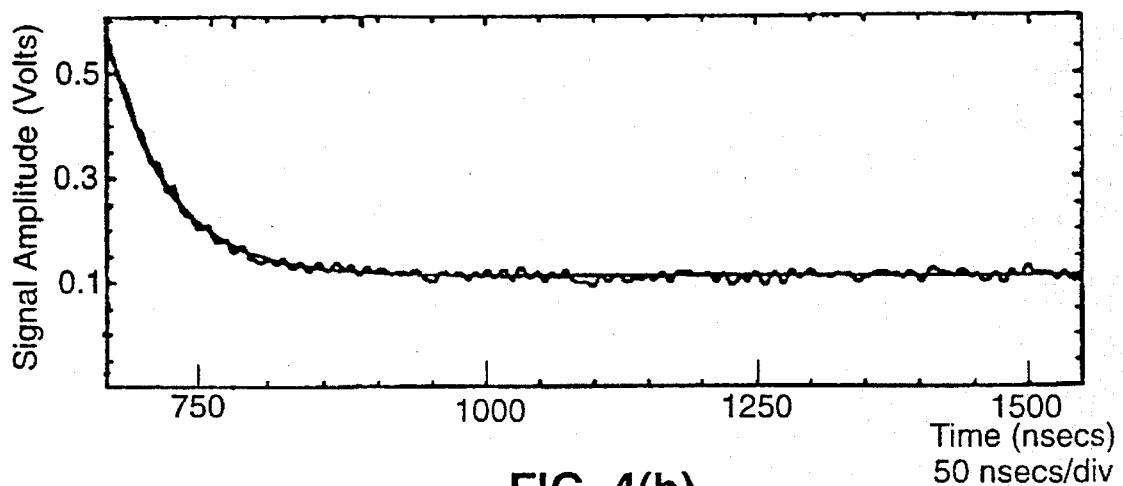
FIG. 4(b) shows the decaying portion of the reflected pulse of FIG. 4(a) superimposed on an exponential function used to estimate the decay.

The plot of FIG. 4(a) shows the voltage amplitude of the reflected write pulse as a function of time, and the reflected pulse exhibits a decay from a peak voltage of about 0.5 volts to a plateau voltage of about 0.1 volts. The decaying portion may be estimated by the above-described exponential function using the values $Y_1=0.11211$ volts, $Y_2=0.402869$ volts, X=56.636 nsecs and T=661.7 nsecs. An exponential function using these values is shown in FIG. 4(b) as a smooth continuous curve superimposed on the decaying portion of the actual reflected write pulse. The close agreement between the smooth exponential curve and the actual reflected pulse indicates that the exponential function provides a good estimate of the actual decaying portion.

Figure 5A:
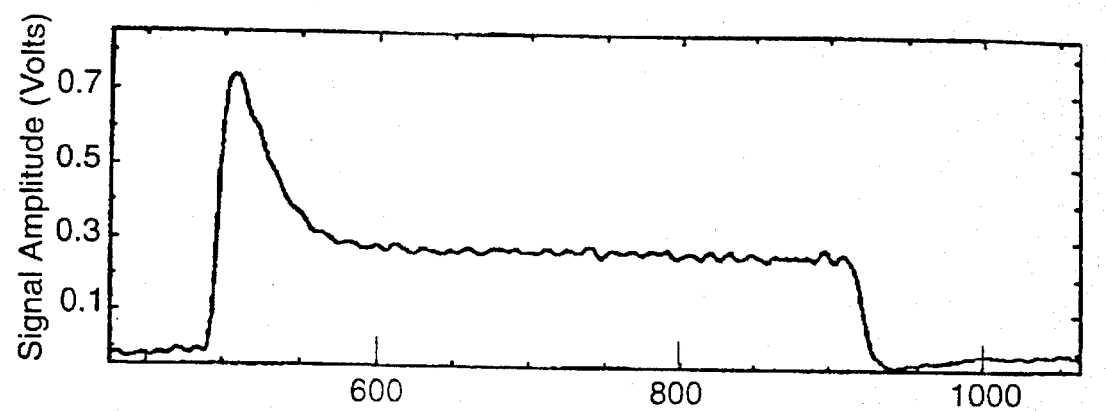
FIG. 5(a) shows an exemplary reflected pulse in a system operating at a 6× write speed.
Figure 5B:
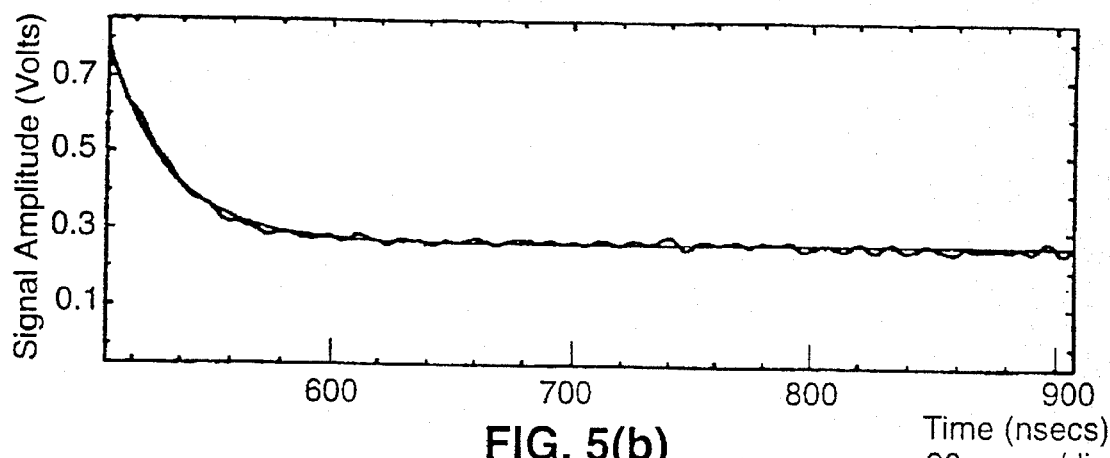
FIG. 5(b) shows the decaying portion of the reflected pulse of FIG. 5(a) superimposed on an exponential function used to estimate the decay.

FIG. 5(a) is a reflected write pulse measured in a system operating at a write speed of about 6×. The reflected write pulse is measured at an optimal incident recording power with an NT write strategy. The exemplary reflected write pulse exhibits a decay from a peak voltage above 0.7 volts to a plateau voltage of less than 0.3 volts. The decay rate may be estimated by the exponential function described above using the values $Y_1=0.26397$ volts, $Y_2=0.488927$ volts, X=25.3862 nsecs and T=510.71 nsecs. An exponential function using these values is shown superimposed on the decaying portion of the reflected write pulse in FIG. 5(b). Again, the close agreement between the smooth exponential curve and the actual reflected pulse indicates that the exponential function provides a good estimate of the actual decaying portion. The measurements shown in FIGS. 4 and 5 show that the reflected pulse decay rate for absorptive dye-based optical media is substantially exponential over a range of system write speeds.

Figure 6A:
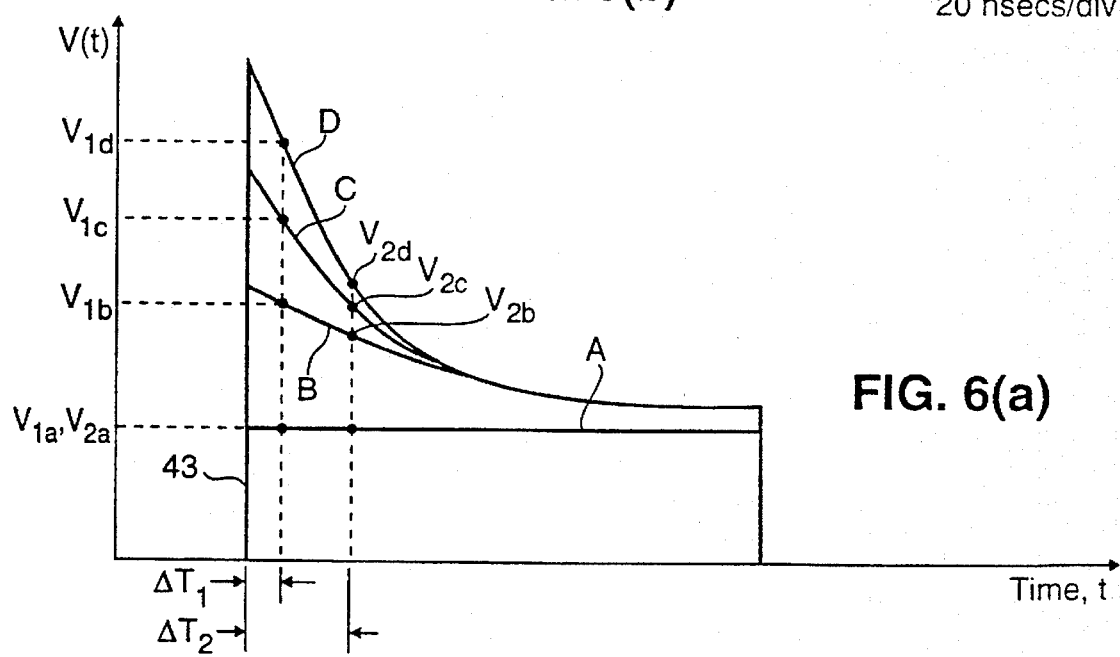
FIG. 6(a) shows four superimposed reflected write pulses resulting from four different incident write signal power levels.
Figure 6B:
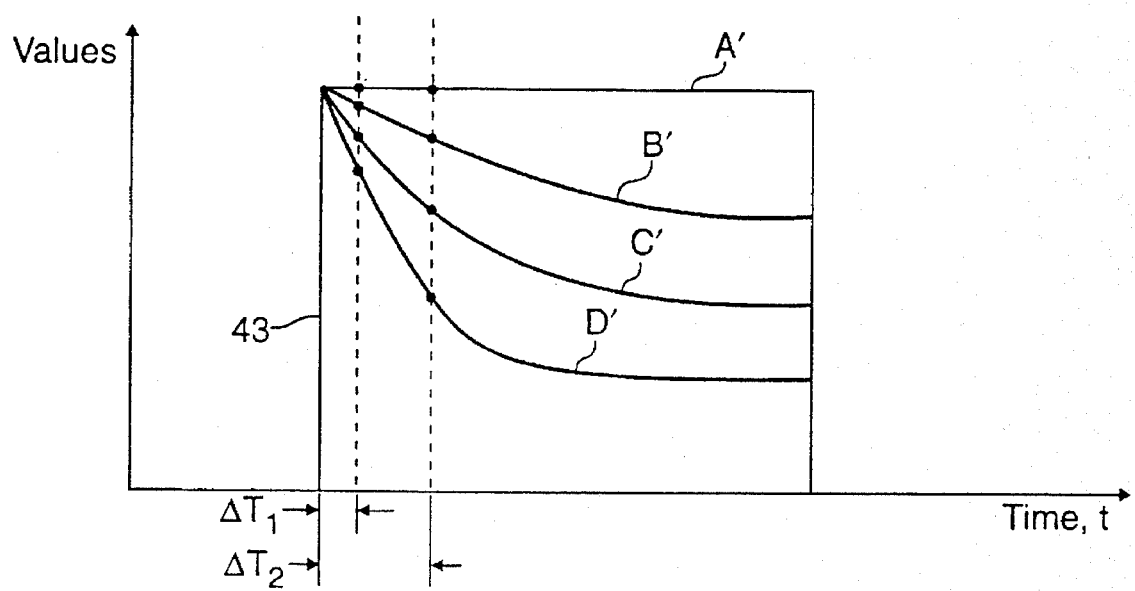
FIG. 6(b) shows the four superimposed pulses of FIG. 6(a) after dividing their voltage amplitudes by their initial peak voltages.

FIG. 6(a) shows several superimposed reflected write pulses with different decay rates. The exemplary reflected write pulses A, B, C and D correspond to electrical signals, and are therefore shown in terms of voltage as a function of time. For illustrative purposes, only the portions of the pulses above a read level, corresponding to the lower level 47 in FIG. 2(c), are shown. The reflected write pulses A, B, C and D in FIG. 6(a) each result from an incident write pulse at a different write power level, with the incident write power level generally increasing from a level insufficient to form a mark, corresponding to reflected pulse A, to a level above an optimal mark formation power level, corresponding to reflected pulse D. The reflected pulse C corresponds to the optimal incident write power. Because no mark is formed by the incident write pulse giving rise to reflected write pulse A, there is no change in the reflectivity of the medium, and therefore the reflected pulse amplitude remains constant for the duration of the incident pulse. The peak voltages and decay rates for each of the reflected pulses B, C and D are different because each pulse is a reflection of an incident write pulse at a different power level. The four exemplary reflected pulses A', B', C' and D' shown in FIG. 6(b) are obtained by dividing the pulses A, B, C and D in FIG. 6(a) by their peak voltage levels. The pulses of FIG. 6(b) more clearly illustrate differences in the pulse decay rates. It should be noted that the two measurement points shown on each pulse A', B', C' and D' in FIG. 6(b) are unitless values rather than voltages.

Figure 6C:
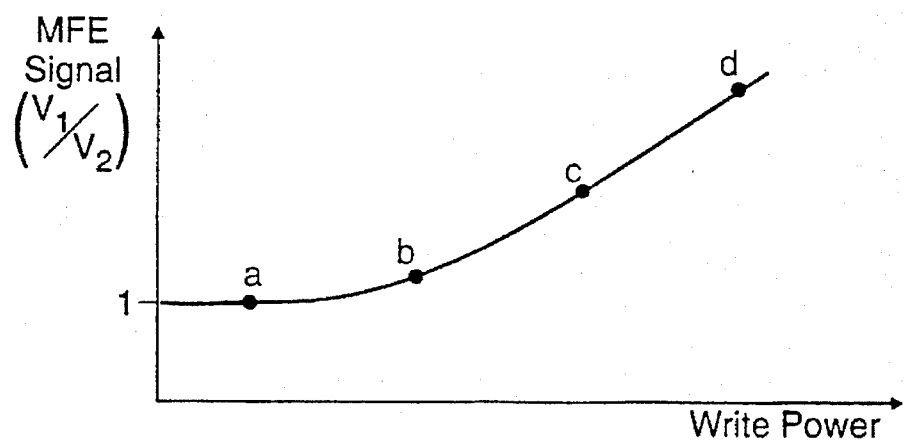
FIG. 6(c) is a plot showing an exemplary mark formation effectiveness signal generated in accordance with the present invention for each of the reflected write pulses of FIG. 6(b).

FIG. 6(c) shows a number of plotted points a, b, c and d. The points a, b, c and d are referred to herein as MFE signals, and represent estimated normalized decay rates for the decaying portion of each of the four reflected write pulses of FIG. 6(a). By dividing a first reflected pulse voltage by a second reflected pulse voltage to estimate a decay rate, the MFE signal is normalized to the reflected pulse, and therefore insensitive to the above-discussed effects, such as media contaminations and imperfections, which alter the reflected signal magnitude. MFE signals for the corresponding pulses of FIG. 6(b) could be generated in a similar manner by dividing the first and the second unitless measurement values shown on each of the pulses A', B', C' and D'. The MFE signal a for the reflected pulse A is computed by dividing a first voltage $V_{1a}$ by a second voltage $V_{2a}$, as shown in FIG. 6(a). In this embodiment, the first and second voltages are measured at a first and a second predetermined time, $\Delta T_1$ and $\Delta T_2$, respectively, after the rising edge 43 of the reflected pulse. The MFE signal a for pulse A has a value of one. As will be discussed below, an MFE signal value of zero, equivalent to the actual decay rate, could be obtained for pulse A by using a linear transformation of the quotient $V_{1a}/V_{2a}$. However, an MFE signal value of one for an actual decay rate of zero provides a reliable indication that no mark has been formed, while properly formed marks have MFE signal values significantly greater than one.

The second exemplary reflected pulse B corresponds to an incident write pulse power level greater than that of pulse A, but below the optimal write power level corresponding to pulse C. The incident power level which gives rise to reflected pulse B causes some change in the reflectivity of the medium, but may be insufficient to properly form a mark. An estimated normalized decay rate corresponding to point b in FIG. 6(c) may be determined by measuring the quotient $V_{1b}/V_{2b}$. As noted above, the third reflected pulse C results from an incident pulse at an optimal write power. An estimated normalized decay rate corresponding to point c in FIG. 6(c) is determined for pulse C by dividing the voltages $V_{1c}$ and $V_{2c}$. Although these two voltage are measured at the same predetermined time points, $\Delta T_1$ and $\Delta T_2$, used to estimate normalized decay rates for pulses A and B, the quotient of the voltages is larger because reflected pulse C has a faster normalized decay rate. The fourth pulse D corresponds to an incident write pulse power level above the optimal write power level. An estimated normalized decay rate corresponding to point d in FIG. 6(c) is determined for the reflected pulse D by measuring the quotient $V_{1d}/V_{2d}$. The normalized decay rate d is faster than the decay rates a, b and c of the exemplary pulses A, B and C. With the incident write pulse power level corresponding to reflected pulse D, a mark is formed very rapidly on the recording medium, and the change in reflectivity is also rapid, resulting in a faster normalized decay rate. Although in this exemplary embodiment both of the predetermined times $\Delta T_1$ and $\Delta T_2$ are shown relative to the rising edge 43 of the reflected pulse 42, the MFE signals in accordance with the present invention do not require precise reference pulse timing relative to the reflected pulse rising edge.

As noted above, FIG. 6(c) is a plot of the MFE signals a, b, c and d corresponding to estimated normalized decay rates obtained for each of the reflected pulses A, B, C, and D. From FIG. 6(c) it can be seen that the MFE signals of the reflected pulses increase as a function of increasing incident write signal power. The plotted points a, b, c, and d correspond to the estimated normalized decay rates of the reflected signal pulses A, B, C and D, respectively, and are arranged in order of increasing incident write signal power. With increasing incident write signal power, the estimated normalized decay rate increases, indicating an increase in the rate at which a mark is formed on the optical medium. The normalized decay rate may be used to indicate if marks have been properly formed by comparing MFE signals corresponding to a series of marks formed in a short time period with a range of acceptable normalized decay rate estimates. For example, all MFE signals less than d but greater than b could be deemed to indicate proper mark formation, while MFE signals greater than or equal to d or less than or equal to b could indicate improper mark formation. Verification of proper mark formation can thereby be performed in real time, as the data is being written on the medium.

Alternative MFE signals may be used to estimate the normalized decay rate of the reflected pulse signals. For example, a linear or non-linear transformation of the quotient $V_1/V_2$ may be used as an MFE signal. One such linear transformation could be performed using the equation:

$$((V_1/V_2)-1)/((V_1/V_2)+1).$$

This linear transformation of the quotient $V_1/V_2$ provides the same amount of normalized decay rate information as the quotient, but when plotted will have a different vertical axis intercept than the plot shown in FIG. 6(c). If the voltage $V_1$ equals the voltage $V_2$, as was the case for the exemplary reflected pulse A in FIG. 6(a), the above linear transformation will produce an estimated normalized decay rate of zero, which is equivalent to the actual normalized decay rate. It may be useful in some applications to have a zero MFE signal value for the condition $V_1$ equal to $V_2$.

Other linear or non-linear transformations of the quotient $V_1/V_2$ could also be used. In addition, measurements other than the quotient $V_1/V_2$, as well as transformations of these other measurements, could be used to estimate the normalized decay rate of the reflected write pulse. An alternative to the quotient of two voltage points may include, for example, taking the difference between two voltage points on the decaying portion of the reflected pulse divided by a third pulse voltage measured after the reflected pulse has reached a steady-state plateau voltage. Additional voltage measurements could be taken on the decaying portion of the reflected pulse to obtain a better estimate of the actual pulse decay rate. Similarly, current or power based calculations may be suitably utilized.

In accordance with the present invention, both of the voltages $V_1$ and $V_2$ may be measured on the decaying portion of the reflected pulse, before the pulse has reached a steady-state plateau voltage level. The exponential function used in FIG. 3 as an estimate of the reflected pulse has an infinitely sharp rising edge to an initial peak voltage followed by a decay to a final plateau voltage. Because of the limited response times of the optical detector 19 and subsequent electronic circuitry, however, the actual reflected pulse rising edge 43 will not be perfectly sharp and the initial peak voltage may be reduced. This effect becomes increasingly significant at write speeds of 6× or higher. One embodiment of the present invention measures $V_1$ as a threshold which is exceeded for a short predetermined time relative to the exponential decay time constant and therefore provides a value that is close to the true peak without being as sensitive to optical detector response times. This $V_1$ voltage measurement provides the same MFE characteristics as the true voltage peak, in applications in which it is very difficult or impossible to measure the true peak. As laser power increases, both the peak to plateau voltage ratio and the exponential time constant X decrease. If voltage $V_2$ were measured on the final plateau portion of the curve, the MFE signal would reflect only one of these effects, the peak to plateau voltage ratio. By locating the second voltage $V_2$ on the decreasing portion of the curve, the MFE signal includes both of these effects, and therefore may be a more sensitive measurement than the peak to plateau voltage ratio alone. By reference to FIG. 6(a), the first and second voltage measurements have been chosen to fall on the decaying portion of a reflected pulse corresponding to a properly formed mark and therefore will provide a good decay rate estimate.

It should be noted that although the reflected write pulses shown in FIGS. 2 through 6 exhibit a decay rate characteristic common to certain types of "burn dark" media, the techniques of the present invention could also be used to verify proper mark formation in other types of recording media with different rate of change characteristics. For example, the present invention could be used with "burn bright" types of optical media, in which an increase in reflectivity occurs during mark formation, such that the reflected pulse voltage increases rather than decays as the mark is formed. Despite such changes in the direction or shape of the reflected pulse rate of change, the rate of change may still be estimated using an MFE signal in accordance with the present invention.

Although the reflected pulse decay rate is generally a function of the type of recording medium, the exact times at which the reflected pulse voltage should be measured may depend, in part, on the write speed of the recording system. In systems operating at write speeds of 6×, which is six times the standard 4.32 Mbits/sec audio CD playback speed, or 25.92 Mbits/sec, the first predetermined time at which the first voltage point is measured may be about 10 nanoseconds after the reflected pulse rising edge 43. The second predetermined time, at which the second voltage used in the MFE signal generation is measured, may be about 30 nanoseconds after the rising edge 43. An exemplary reflected write pulse measured in a system operating at a 6× write speed was shown in FIG. 5(a). For a system operating at a 2× write speed, such as the system in which the write pulse of FIG. 4(a) was measured, the first voltage may be measured at about 15 nsecs while the second voltage may be measured at about 60 nsecs. The measurement times will thus vary for different optical write speeds, and may also be modified in a straightforward manner to accommodate the different rates of change associated with other types of optical media.

Figure 7:
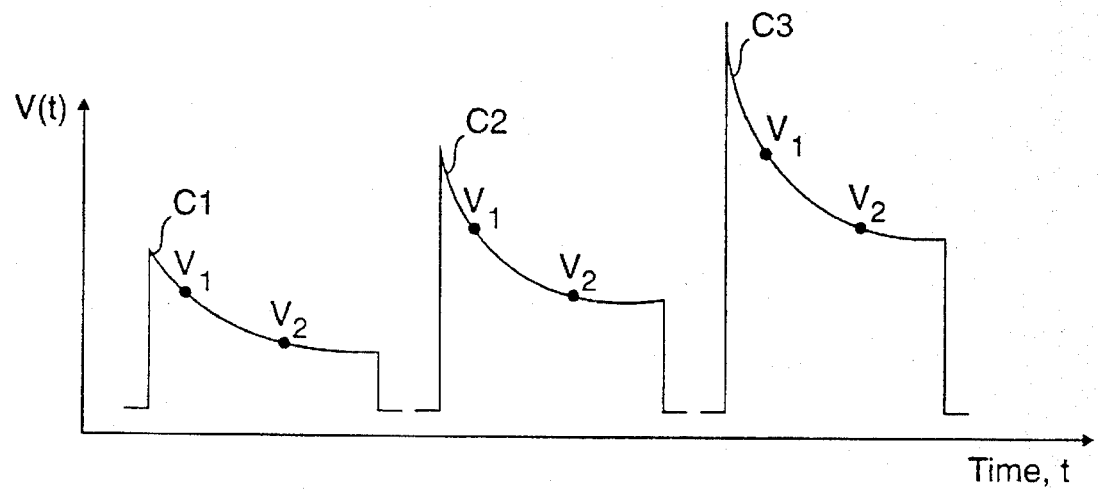
FIG. 7 illustrates three exemplary unnormalized reflected write pulses having a constant decay rate but different reflected signal magnitudes.

FIG. 7 illustrates the insensitivity of the MFE signals of the present invention to changes in reflected signal magnitude. In general, a variety of multiplicative effects, such as disk substrate birefringence and media contaminations or imperfections, result in scaling of the reflected signal magnitude. FIG. 7 shows three exemplary reflected write pulses, C1, C2 and C3, which are scaled in magnitude due to these multiplicative effects. Although the reflected pulse magnitudes are different in each of the pulses C1, C2 and C3, the normalized decay rate of each of the pulses is the same, and corresponds to proper mark formation. Thus, this normalized decay rate should correspond to the decay rate of pulse C in FIG. 6(a) resulting from an incident write pulse at an optimal power level. The differences in reflected signal magnitude may be due to effects such as obscuration. By using an MFE signal equivalent to the quotient $V_1/V_2$ as a normalized decay rate estimate, the same normalized decay rate will be measured for each of the pulses C1, C2 and C3, regardless of the differences in the reflected pulse magnitudes. The normalization of the present invention thus overcomes problems associated with certain prior art DRDW techniques in which variation in reflected pulse magnitude affects the accuracy of write verification, such as techniques which normalize to an incident optical signal power level.

Figure 8:
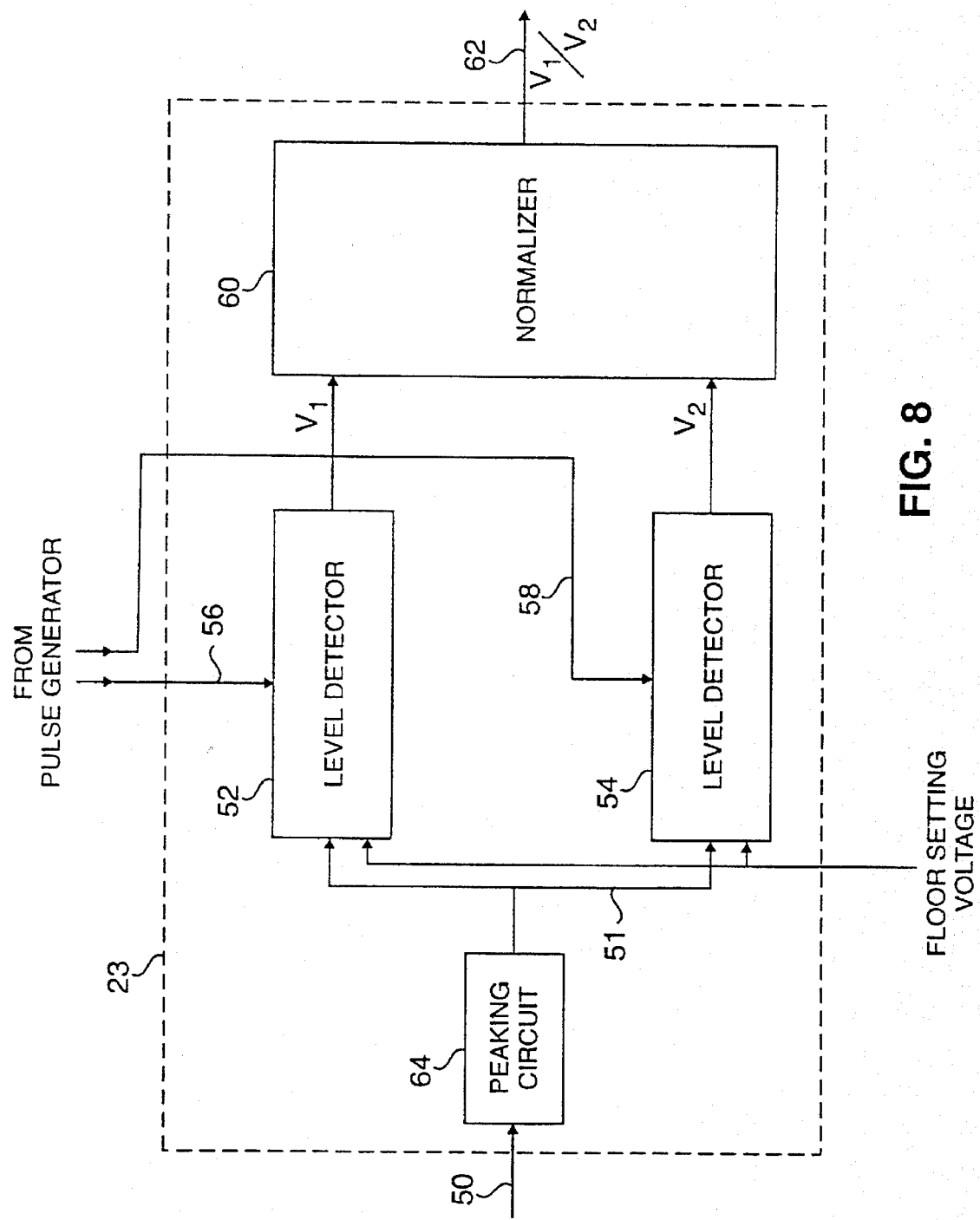
FIG. 8 is a block diagram of an exemplary mark formation effectiveness (MFE) signal generator in accordance with the present invention.

FIG. 8 is a block diagram of an exemplary MFE signal generator 23 in accordance with the present invention. The MFE signal generator 23 operates to measure the voltages $V_1$ and $V_2$ of FIG. 6(a) and to perform a normalization step by, for example, dividing $V_1$ by $V_2$. The exemplary MFE signal generator 23 includes a reflected write voltage signal input 50, a first level detector 52, a second level detector 54, a normalizer 60 and a peaking circuit 64. The operation of the peaking circuit 64 will be described in conjunction with FIG. 9 below. Reference pulse generator 27 in FIG. 1 provides a first reference pulse signal, with pulses of a first predetermined time duration $\Delta T_1$, to a reference pulse input 56 of the first level detector 52. Reference pulse generator 27 also provides a second reference pulse signal, with pulses of a second predetermined time duration $\Delta T_2$, to a reference pulse input 58 of the second level detector 54. Alternatively, separate reference pulse generators for each of the level detectors could be incorporated into the MFE signal generator 23. A reflected write signal is supplied on input 50 to the peaking circuit 64 and thereby to both the first and the second level detectors 52, 54. The measured voltages $V_1$ and $V_2$ are the levels which the reflected pulse exceeds for predetermined times $\Delta T_1$ and $\Delta T_2$, respectively. In one embodiment of the level detectors 52, 54, the first and second voltage thresholds are produced internally within the detectors. As discussed further in conjunction with FIG. 10 below, in such an embodiment the level detectors 52, 54 may continually adjust the first and second voltage thresholds until the reflected pulse at input 50 exceeds the thresholds for the predetermined times $\Delta T_1$ and $\Delta T_2$, respectively. In this way, the first level detector 52 detects first voltage $V_1$ while the second level detector detects second voltage $V_2$. It should be noted that in alternative embodiments of the MFE signal generator 23, other types of level detectors may be used, and the peaking circuit 64 and floor setting voltage input may be eliminated.

The first and second measured voltages $V_1$ and $V_2$ are then supplied to the normalizer circuit 60. The normalizer circuit estimates a normalized decay rate of the reflected pulse by, for example, dividing the first voltage $V_1$ by the second voltage $V_2$. The output 62 of the normalizer circuit 60 may therefore be the quotient $V_1/V_2$, described in conjunction with FIGS. 6 and 7 above. The output 62 of the MFE signal generator 23 may be supplied to the comparison means 25 for verification that, for example, a particular series of marks were properly formed.

The MFE signal generator 23 of the present invention is well-suited for generating measures of mark formation quality in systems which utilize many different types of write strategies and write pulse waveforms. For example, the MFE signal generator 23 will provide accurate measures of mark formation quality with a non-flat-topped write strategy, or with short reflected pulses which may never reach a steady-state plateau.

The peaking circuit 64 between the reflected write signal input 50 and the first and second level detectors 52, 54 may be used to increase the decay rates of the reflected write pulses in order to facilitate level detection. For example, certain embodiments of the first and second level detectors 52, 54 may exhibit improved performance if every reflected write pulse, even a flat-top pulse such as the pulse A in FIG. 6(a), has a non-zero decay rate. The peaking circuit can be used to produce a voltage peak on a flat-top pulse, and to produce a steeper decay rate for reflected pulses which already exhibit a decay rate, such as pulses B, C and D in FIG. 6(a). In general, the peaking circuit 64 produces a minimum decay rate for flat-top pulses, and proportionately steeper decay rates for other pulses. The peaking circuit thus maintains differentiation among reflected pulse waveforms, such that the decay rates may still be used to indicate proper mark formation.

Figure 9:
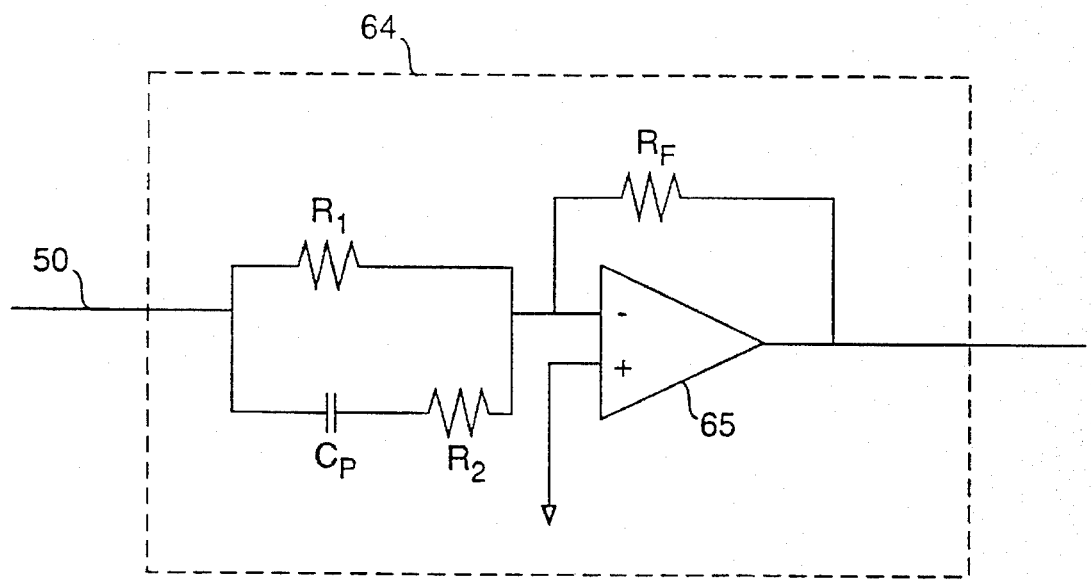
FIG. 9 is a schematic diagram of an exemplary peaking circuit in accordance with the present invention, for use in the MFE signal generator of FIG. 8.

FIG. 9 is a schematic diagram of an exemplary embodiment of the peaking circuit 64. The exemplary peaking circuit 64 operates as an inverting filter, which inverts the incoming reflected pulse signal and introduces a minimum decay rate. Flat-topped pulses with no initial decay rate then exhibit the minimum decay rate, while pulses with an existing decay rate exhibit an increased decay rate. The circuit 64 of FIG. 9 includes an op-amp 65 with a feedback resistor $R_F$ and two input resistors $R_1$ and $R_2$ arranged in parallel. A capacitor $C_P$ is arranged in series with resistor $R_2$ and in parallel with resistor $R_1$. The high-frequency gain of the peaking circuit is given by $-R_F/R_P$, where $R_P$ is the parallel combination of $R_1$ and $R_2$, while the low-frequency gain is given by $-R_F/R_1$. The high-frequency gain determines the output peak voltage, and the low-frequency gain determines the output plateau voltage. A suitable embodiment may utilize 680 Ohm resistors for $R_F$, $R_1$ and $R_2$, and a 39 picoFarad capacitor for $C_P$, such that the peaking circuit high-frequency gain is $-2.0$, and the low-frequency gain is $-1.0$. The exemplary peaking circuit of FIG. 9 will invert the reflected signal pulses, so an additional inversion stage may be included either before or after the peaking circuit. Alternatively, the level detectors 52, 54 and normalizer 60 may be designed to generate appropriate MFE signals from inverted reflected write pulses.

Figure 10:
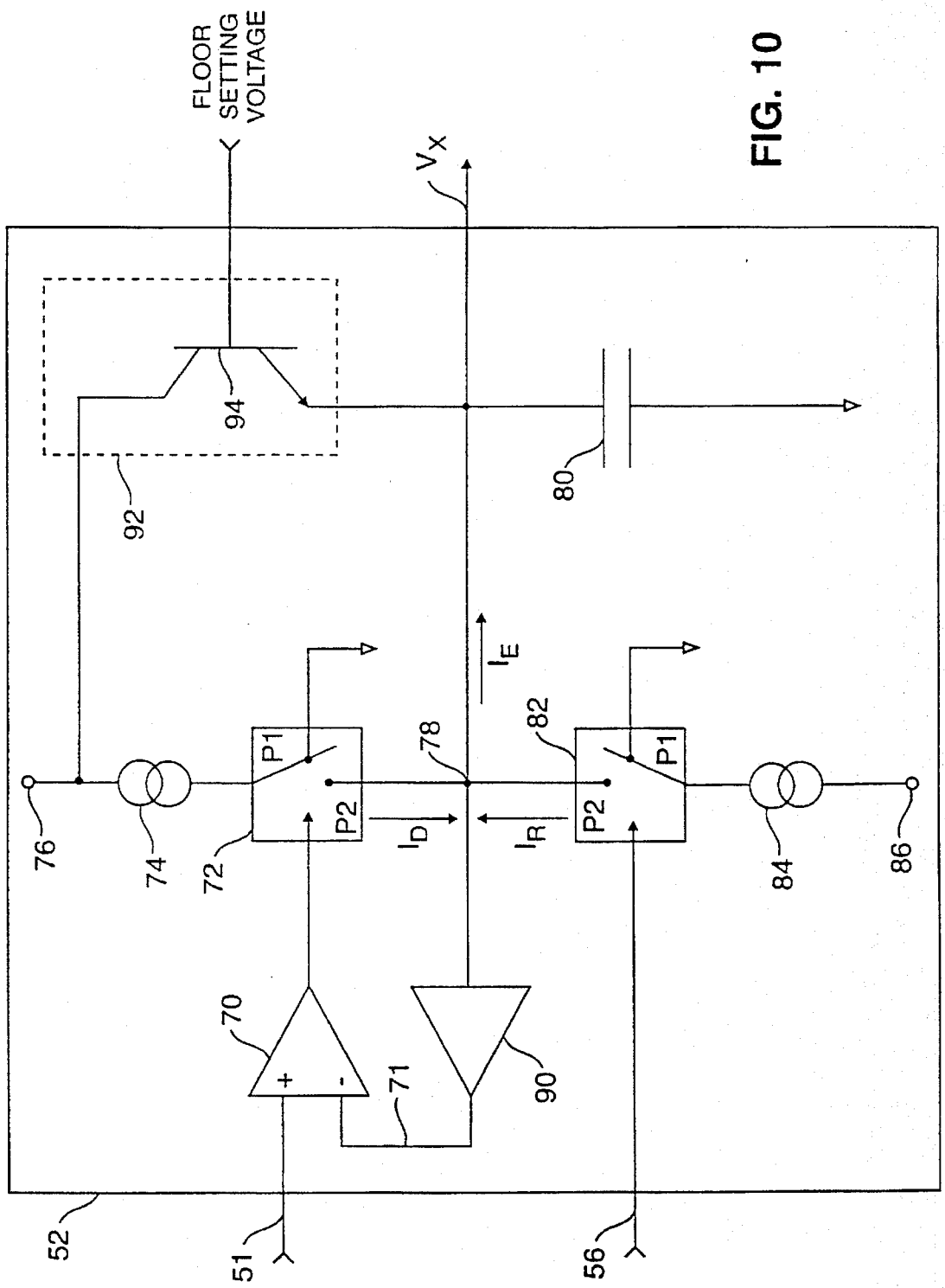
FIG. 10 is a schematic diagram of an exemplary level detector in accordance with the present invention, for use in the MFE signal generator of FIG. 8.

FIG. 10 is a schematic diagram of an exemplary level detector 52 for use in the MFE signal generator 23 of FIGS. 1 and 8. Although the exemplary level detector is designated by the reference numeral 52, it should be understood that a similar circuit, but modified in a straightforward manner to operate with reference pulses of a different time duration, could also be used for level detector 54. The level detector 52 includes a reflected write signal input 51 for receiving a reflected write signal from, for example, the peaking circuit 64, and a reference pulse input 56 for receiving a reference pulse signal from the reference pulse generator 27. In other embodiments, the peaking circuit 64 may be eliminated and the level detector 52 may receive a reflected write signal directly from signal combiner 22.

Prior art DRDW techniques typically attempt to measure a reflected pulse voltage at a fixed time after a reference event such as a rising edge or an initial peak. The time of such an event must be known very accurately in order to avoid sampling errors, because the pulse waveform itself is changing with time. The exemplary level detector 52 of FIG. 10 does not depend on such a separate trigger event to establish sample timing. Instead, it finds the voltage threshold $V_T$ which a reflected pulse exceeds for a desired predetermined time duration $\Delta T_X$. With the "burn dark" type of optical media currently used in recordable CDs, this is an accurate way to measure reflected voltages after the start of a reflected pulse without needing to know exactly when the pulse starts.

The reflected write signal is supplied to a first input of a comparator 70. Other signal comparing means may also be used in place of comparator 70. The output of comparator 70 switches a first current switch 72 from a first position P1 to a second position P2 when the voltage at the first comparator input is greater than the voltage at a second comparator input. In the embodiment shown, the first comparator input is non-inverting and the second input is inverting. During the intervals between reflected write pulses, the switch 72 is in the first position P1, and a first current source 74 is connected between a positive voltage reference 76 and ground potential. When a reflected write pulse received at the comparator noninverting input via line 50 exceeds the voltage on line 71, the first switch 72 is switched to its second position P2, connecting first current source 74 to an output of detector 52, designated by circuit node 78. The voltage at node 78 is the output voltage $V_X$ of the detector 52, which will be the first voltage $V_1$. When the level detector in FIG. 10 is used for the detector 54, the output voltage $V_X$ will be the second voltage $V_2$.

When the switch 72 is in the second position P2, a detector current signal, designated $I_D$, flows into node 78. The detector output voltage $V_X$ at node 78 is fed back along signal line 71 to the comparator inverting input, such that the first current source 74 supplies the current $I_D$ to node 78 when the voltage level of a reflected write pulse at the non-inverting input of comparator 70 is greater than the detector output voltage $V_X$. The exemplary detector 52 also includes a second switch 82 that is responsive to a reference pulse signal received on reference pulse input 56. A reference pulse in the received reference pulse signal switches the second switch 82 from its first position P1, in which a second current source 84 is connected between a negative voltage reference 86 and ground potential, to its second position P2. With switch 82 in its second position P2, the second current source 84 is connected via second switch 82 from negative voltage reference 86 to node 78, such that a reference current signal, designated $I_R$, flows into node 78. The duration of the reference pulse therefore determines the amount of time for which second current source 84 supplies current to the detector output node 78. Neglecting any current flowing into the buffer amplifier 90, the error current signal $I_E$ is the sum of the current signals $I_D$ and $I_R$ entering node 78. A capacitor 80 is connected between the detector output and ground potential and will charge toward the positive voltage reference 76 through switch 72 and current source 74 when the error current signal leaving node 78, designated $I_E$, is positive. When the current $I_E$ is negative, capacitor 80, and therefore the detector output voltage $V_X$, will charge toward negative voltage potential 86 via switch 82 and current source 84. Both first and second current sources 74, 84 are thus used to supply current to the detector output. Capacitor 80 charges and discharges in response to current supplied to output node 78 by the first and second current sources 74, 84, and thereby alters the detector output voltage $V_X$. Other types of energy storage means may also be used in place of capacitor 80.

As noted above, the total current seen by capacitor 80 is approximately the sum of the currents $I_D$ and $I_R$ from first and second current sources 74 and 84, respectively. The sum of $I_D$ and $I_R$ will be approximately zero, and the level detector output voltage $V_X$ will reach a steady-state value, when the detector output voltage $V_X$ reaches a desired voltage threshold $V_T$. When the amplitude or shape of the reflected write pulses change, the level detector 52 output voltage $V_X$ moves toward a new desired threshold voltage $V_T$. The new threshold voltage may be used as a first or second voltage to generate an MFE signal in the manner described in conjunction with FIGS. 3 through 8. If a series of marks are improperly formed, the detector output voltage will change to track the new threshold voltage, and the change will be reflected in the resultant MFE signal.

In the exemplary level detector circuit of FIG. 10, it may be desirable to include a buffer amplifier 90 connected between the detector output, designated by node 78, and the inverting input of the comparator 70. The buffer amplifier 90 should be capable of operating at relatively high speeds, in order to minimize signal delay and to preserve proper rise and fall times at pulse widths on the order of 10 nanoseconds or less. The signal delay through the buffer amplifier 90 should be minimized such that any changes in detector output voltage $V_X$ at node 78 are present as quickly as possible at the inverting input of comparator 70. Minimizing the delay between node 78 and the inverting input of comparator 70 will permit more precise control of the error current $I_E$ supplied to the capacitor 80, and therefore better detection of a reflected pulse voltage level. One high speed buffer amplifier which may be used is the OPA 620, available from Burr Brown Corporation. Because the input impedance of buffer amplifier 90 is generally very high relative to the output impedance of the detector circuit, any current flowing out of node 78 toward the buffer amplifier and comparator inverting input will be neglected herein for illustrative purposes. The buffer amplifier 90 also serves to isolate any variation in the impedance of the comparator inverting input. A slower buffer amplifier may be used for buffer amplifier 90, along with additional circuitry to prevent instabilities in the detector output voltage which may result from excessive signal delay between node 78 and the inverting input of the comparator 70. Such additional circuitry may include, for example, the peaking circuit 64, which improves the performance of the detector circuit by scaling the decay rates of incoming reflected write pulses such that all incoming pulses exhibit a minimum decay rate.

The performance of the detector circuit may be further improved by including a floor circuit 92 connected between the output node 78 and the positive voltage reference 76. The exemplary floor circuit 92 includes a bipolar transistor 94 with an emitter connected to the output node 78, a collector connected to the positive voltage reference 76, and a gate connected to a floor setting voltage, which may be supplied by, for example, a digital-to-analog convertor controlled by processor 26. The floor circuit prevents the detector output voltage from falling more than 0.6 volts below the floor setting voltage. In general, a floor setting voltage which limits the minimum detector output voltage to about 10% of the nominal reflected pulse peak voltage will improve circuit performance without reducing detector accuracy. Performance is improved in part because small detector output voltages, which are susceptible to noise and may lead to unrealistic measurements, are avoided. For example, the floor circuit avoids a zero divided by zero condition when the reflected write signal is totally obscured due to an imperfection or contamination of the optical medium.

The exemplary level detectors 52, 54 described above track voltage thresholds across a series of reflected pulses, such that a single improper decay rate may be insufficient to significantly alter the estimated decay rate. However, it should be understood that alternative level detectors may also be used in the MFE signal generator of the present invention. These alternative level detectors may be modified, in a manner known in the art, to permit measurement of a decay rate for each reflected write pulse, rather than for a series of pulses.

Figure 11A:
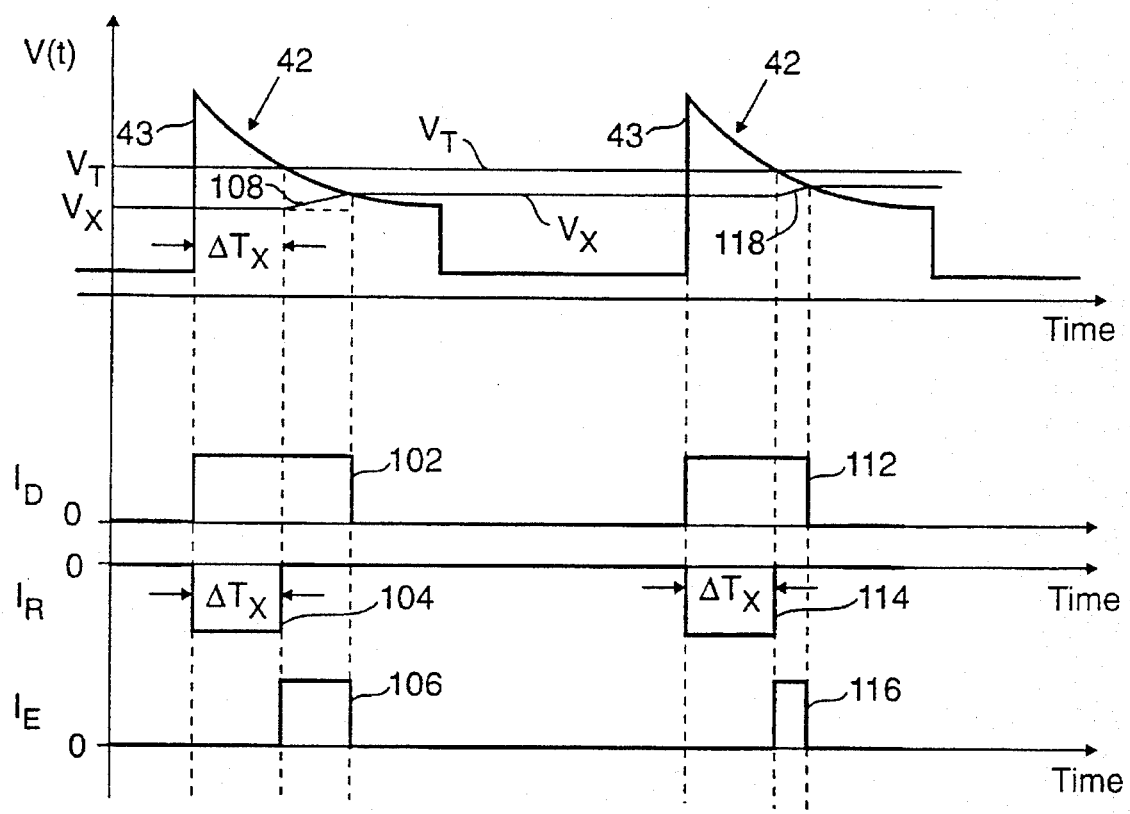
FIG. 11(a) is a series of timing diagrams illustrating the operation of the exemplary level detector of FIG. 10 when the initial detected voltage level is below a desired voltage threshold.

FIG. 11(a) is a timing diagram illustrating the operation of the exemplary level detector 52 of FIG. 10 when the output voltage $V_X$ of detector 52 is below the desired detector voltage threshold $V_T$. A reflected write signal V(t) is shown, and includes exemplary reflected write pulses 42. The desired voltage threshold $V_T$ of the detector 52 corresponds to a voltage that the reflected pulse 42 exceeds for a time $\Delta T_x$. The time $\Delta T_x$ corresponds to one of the predetermined pulse time durations $\Delta T_1$ or $\Delta T_2$ of either the first or second input reference pulses, respectively, depending upon whether the detector is being used to detect the first or the second voltage $V_1$ or $V_2$. As noted above, $V_X$ represents the actual detector output voltage. The voltage $V_X$ varies as a function of the current signal $I_E$, which is the sum of the current signals $I_D$ and $I_R$. The exemplary current signal $I_D$ shown in FIG. 11(a) is the current flowing from first current source 74 to output node 78, which is non-zero when first switch 72 is in its closed position P2. A first pulse 102 of current signal $I_D$ therefore has a time duration equivalent to an amount of time for which the reflected pulse 42 voltage is greater than the voltage $V_X$, which determines the output level of comparator 70 and thereby the state of switch 72.

The exemplary current signal $I_R$ shown in FIG. 11(a) is the current flowing from second current source 84 to output node 78, which is non-zero when second switch 82 is in its closed position P2. The current signal $I_R$ is defined as flowing in a direction opposite that of the current signal $I_D$, such that a current pulse 104 of current signal $I_R$ is opposite in sign from the current pulse 102 of current signal $I_D$. The current pulse 104 has a predetermined pulse duration $\Delta T_x$, which corresponds to the time for which the reflected pulse voltage exceeds the desired threshold $V_T$. As previously noted, the current signals $I_D$ and $I_R$ are summed at output node 78 and result in the error current signal $I_E$. The current signal $I_E$ provides current to output capacitor 80 during a period of time given by the difference between the time duration of current pulses in the current signals $I_D$ and $I_R$. The sign of the $I_E$ current pulses, and therefore the direction of voltage change for capacitor 80, depends upon whether the $I_D$ current pulses, such as current pulse 102, are longer or shorter than the $I_R$ current pulses, such as current pulse 104.

When the detected voltage output $V_X$ is below the desired threshold voltage $V_T$, as in FIG. 11(a), the $I_D$ current pulses are longer than the $I_R$ current pulses, and therefore the capacitor 80 charges toward the threshold voltage $V_T$. The $I_E$ current pulse 106 is positive in sign because the positive $I_D$ current pulse 102 has a longer duration than the negative $I_R$ current pulse 104. When the $I_E$ current pulse 106 is positive, the current $I_E$ is supplied from first current source 74 and capacitor 80 therefore charges toward the positive voltage reference 76. The capacitor 80 charges toward this voltage for the duration of the $I_E$ current pulse 106, as indicated by the increasing portion 108 of the detector output voltage $V_X$. The reflected pulse voltage eventually decays sufficiently that the detector output voltage $V_X$, present at the inverting input of comparator 70, is greater than the reflected pulse voltage present at the comparator non-inverting input. As a result, the output of comparator 70 is triggered to a level which switches the first switch 72 into its first position P1, disconnecting first current source 72 from the output node 78.

The next reflected pulse 42 in the exemplary write signal of FIG. 11(a) also has a voltage which exceeds the detector output voltage $V_X$ for a period of time. While the reflected pulse voltage is higher than $V_X$, the comparator output is at a logic high level, and the first switch 72 is switched to its second position P2, connecting first current source 74 to the output node 78, resulting in a second $I_D$ current pulse 112. The time duration of the second $I_D$ current pulse 112 is shorter than that of the first $I_D$ current pulse 102 because the detector output voltage $V_X$ has increased due to the charging of capacitor 80 during the previous reflected write pulse 42. The pulse 114 of current signal $I_R$ has the same predetermined time duration $\Delta T_r$ as the pulse 104. As noted above, the time duration of the $I_R$ current pulses 104, 114 set a desired threshold voltage $V_T$ which the reflected pulse exceeds for the time duration $\Delta T_x$. The duration of $I_E$ current pulse 116 is determined by the sum of the $I_D$ and $I_R$ current pulses 112 and 114, respectively, at output node 78. The duration of $I_E$ current pulse 116 is shorter than that of the $I_E$ current pulse 106, because the detector output voltage $V_X$ has charged toward the voltage $V_T$ during the previous reflected pulse, and is therefore closer to $V_T$ than it was at the start of the previous reflected pulse. The duration of increasing portion 118 of detector output voltage $V_X$ is also reduced relative to increasing portion 108, and the resulting change in $V_X$ is less than it was during the previous pulse.

Figure 11B:
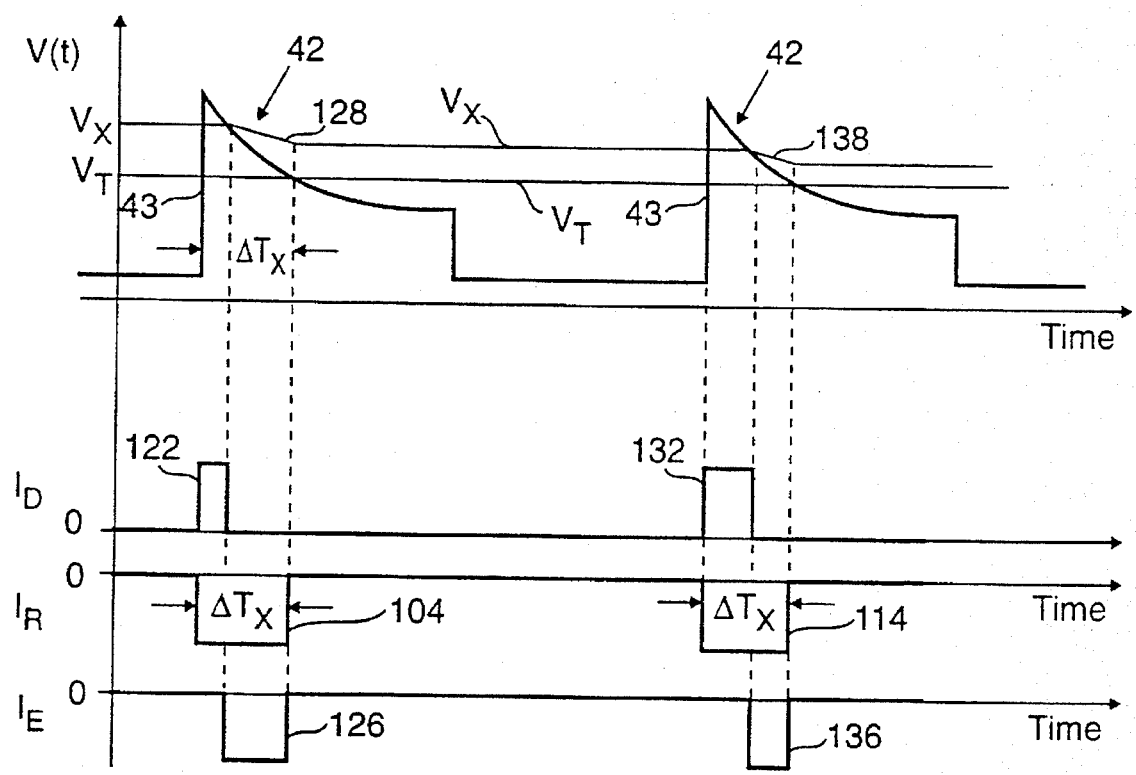
FIG. 11(b) is a series of timing diagrams illustrating the operation of the level detector of FIG. 10 when the initial detected voltage level is above a desired voltage threshold.

The timing diagram of FIG. 11(b) illustrates the operation of the level detector of FIG. 10 when the detected voltage level $V_X$ is above a desired voltage threshold $V_T$. In this case, the $I_D$ current pulse 122 is shorter than the $I_R$ current pulse 104, because the reflected pulse voltage exceeds the detector output voltage $V_X$ for a period of time shorter than $\Delta T_x$. The sum of the $I_D$ current pulse 122 and the $I_R$ current pulse 104 therefore results in an $I_E$ current pulse 126 which is negative in sign. Capacitor 80 then charges toward negative voltage reference 86 via second switch 82 and second current source 84, as shown by a decreasing portion 128 of voltage $V_X$. The charging toward negative voltage reference 86 brings $V_X$ closer to the desired threshold $V_T$. At the next reflected pulse, the $I_D$ current pulse 132 is longer, and the $I_E$ current pulse 136 is therefore shorter. Capacitor 80 charges toward negative voltage reference 86 for a shorter amount of time, indicated by decreasing portion 138 of detector voltage $V_X$, and the resulting change in $V_X$ is less than it was during the previous pulse.

Figure 11C:
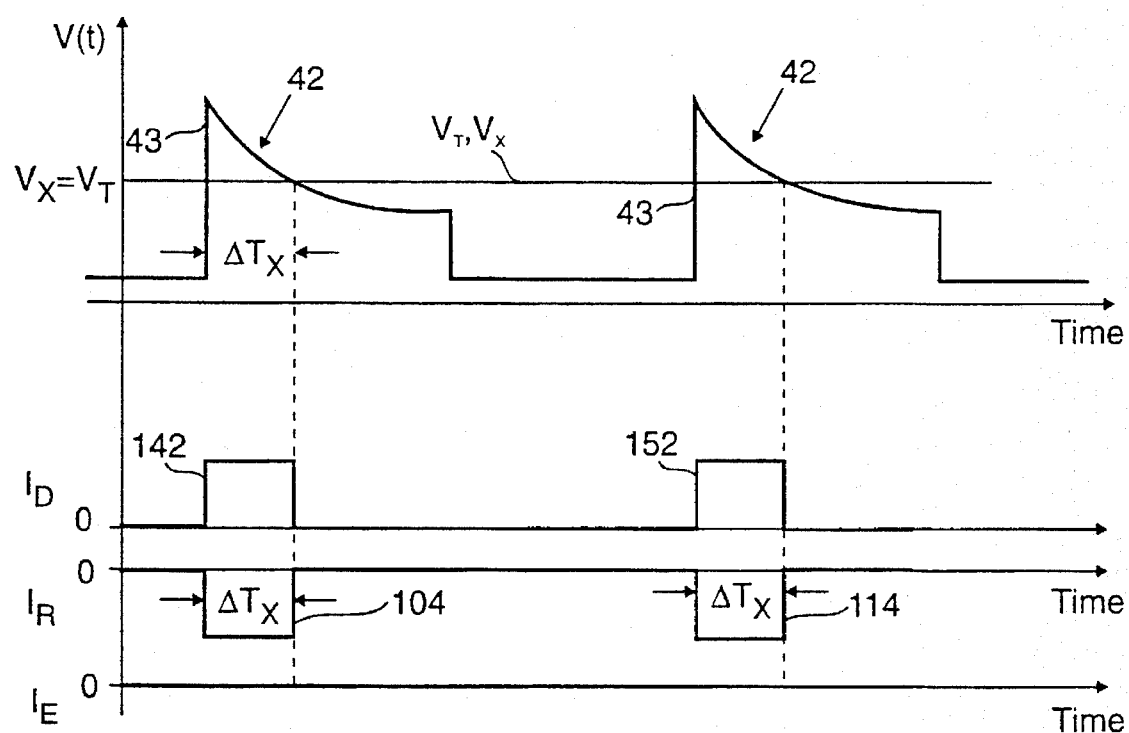
FIG. 11(c) is a series of timing diagrams illustrating the operation of the level detector of FIG. 10 when the initial detected voltage level is at a desired voltage threshold.

FIG. 11(c) shows the operation of the level detector of FIG. 10 when the detector voltage output $V_X$ reaches the desired detector voltage threshold $V_T$. In this case, the $I_D$ current pulses 142, 152 have the same time duration as the $I_R$ current pulses 104, 114. The error current $I_E$ is therefore zero, and the voltage $V_X$ remains at the desired voltage threshold $V_T$. When the magnitude or decay rate of a series of reflected pulses changes, resulting in a new desired threshold voltage $V_T$, the detector output voltage $V_X$ will move toward the new $V_T$ in the manner previously described. The MFE signal will therefore track changes in the reflected signal, and may be used as an indicator of improper mark formation.

Although the $I_D$ and $I_R$ pulses 142, 104 are shown in FIG. 11(c) as being of the same amplitude and duration, it should be noted that the detector output voltage may be maintained at the desired threshold voltage $V_T$ using $I_D$ and $I_R$ pulses which are of unequal amplitudes and durations. For example, if the $I_R$ pulse 104 was shortened by a factor of two, but also increased in current amplitude by a factor of two, the net charging effect on the capacitor 80 would be unchanged, and the $I_R$ pulse would still offset the charging effects of the $I_D$ pulse 142 such that the detector output voltage would be maintained at the desired threshold voltage $V_T$. In general, the net charging of the capacitor 80 for a single reflected pulse will be approximately zero if the pulse duration-amplitude product is substantially the same for both the $I_D$ and $I_R$ current pulses.

Figure 12A:
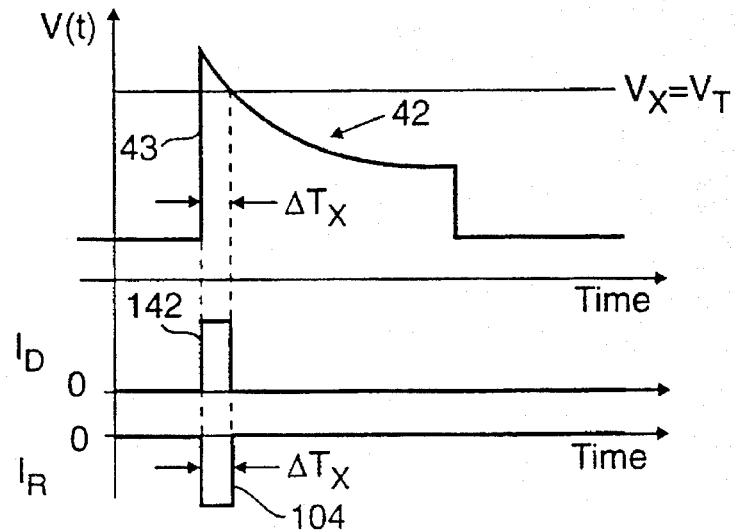
FIGS. 12(a) to 12(c) are a series of timing diagrams illustrating the insensitivity of the level detector of FIG. 10 to errors in the synchronization of sample pulses with reflected pulses.
Figure 12B:
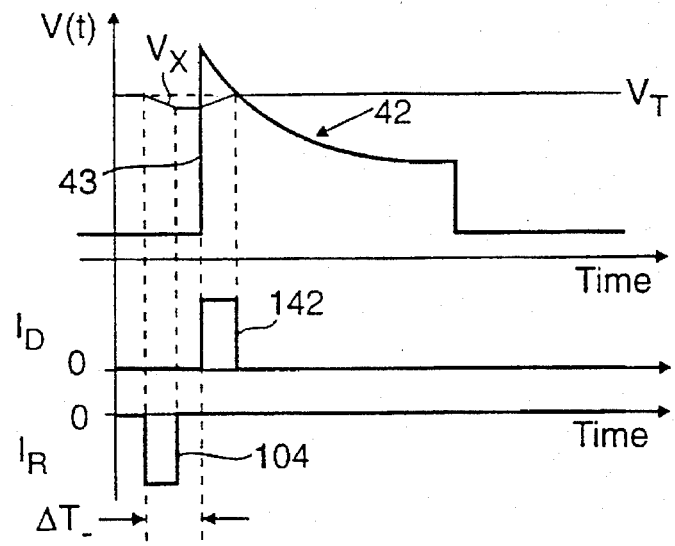
Figure 12C:
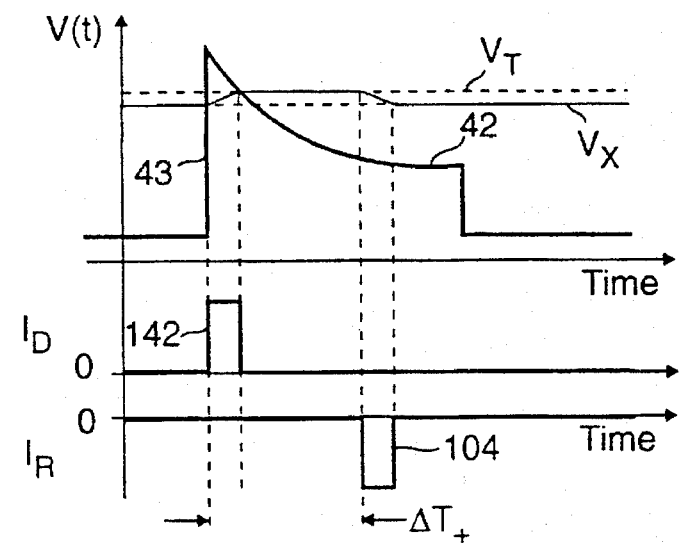

FIGS. 12(a) to 12(c) illustrate the reduced sensitivity of the present invention to reference pulse timing errors. In general, prior art DRDW systems require precise sample timing for accurate measurement of reflected pulse voltage levels. An exemplary embodiment of the MFE signal generator of the present invention, however, utilizes level detectors which are relatively insensitive to sample timing errors. The timing diagram of FIG. 12a is similar to that of FIG. 11c, in which the $I_D$ pulse 142 coincides with, and is directly offset by, the $I_R$ pulse 104. However, the $I_R$ reference pulse 104 may arrive before or after the $I_D$ pulse 142 without a major disturbance in the operation of the level detector circuit of FIG. 10. For example, as shown in FIG. 12b, the $I_R$ reference pulse 104 may arrive a time $\Delta T_-$ before the rising edge 142 of the reflected pulse 42. Before the reference pulse, the detector output voltage $V_X$ equals the threshold $V_T$. The temporary reduction in $V_X$ by the $I_R$ reference pulse 42 will be offset by an equal and opposite charging by the $I_D$ current pulse 142 when the reflected pulse exceeds $V_X$. A small measurement error will result if the detector output $V_X$ is simply time averaged, since $V_X$ falls below $V_T$ for a short time between the $I_R$ and $I_D$ pulses. There would be no measurement error at all if the level $V_X$ were sampled only between reflected write pulses, when $V_X$ is equal to $V_T$. Prior art techniques with similar errors in sample pulse timing would measure the reflected pulse before the rising edge. This, of course, would result in a much greater voltage level measurement error.

FIG. 12c is a timing diagram illustrating the effect of an $I_R$ reference pulse 104 which arrives time $\Delta T_+$ after the reflected pulse rising edge. The detector output voltage $V_X$ starts out slightly below $V_T$, and increases to $V_T$ during the current pulse $I_D$, when the reflected pulse exceeds $V_X$. When the reference pulse $I_R$ arrives, $V_X$ returns to its starting value. As with FIG. 12b, the difference between $V_X$ and $V_T$ is much less than the measurement error of prior art techniques with similar sample pulse errors.

In general, the $I_R$ reference pulse 104 may precede or follow the reflected pulse rising edge by times $\Delta T_-$ and $\Delta T_+$, where $\Delta T_-$ and $\Delta T_+$ are less than the time interval between adjacent pulses, with much less measurement error than with prior art techniques.

Figure 13A:
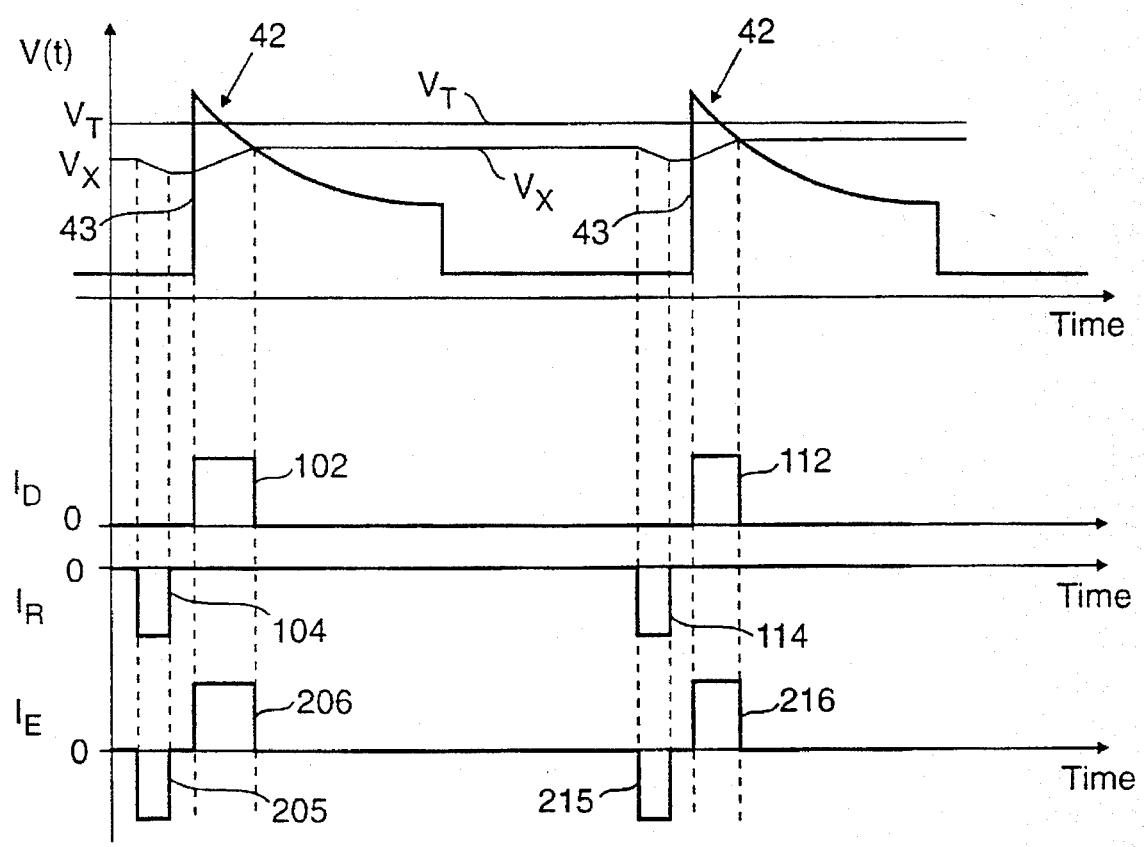
FIGS. 13(a) to 13(c) are a series of timing diagrams illustrating the operation of the circuit of FIG. 10 in response to a reference pulse arriving before the reflected write pulse rising edge.
Figure 13B:
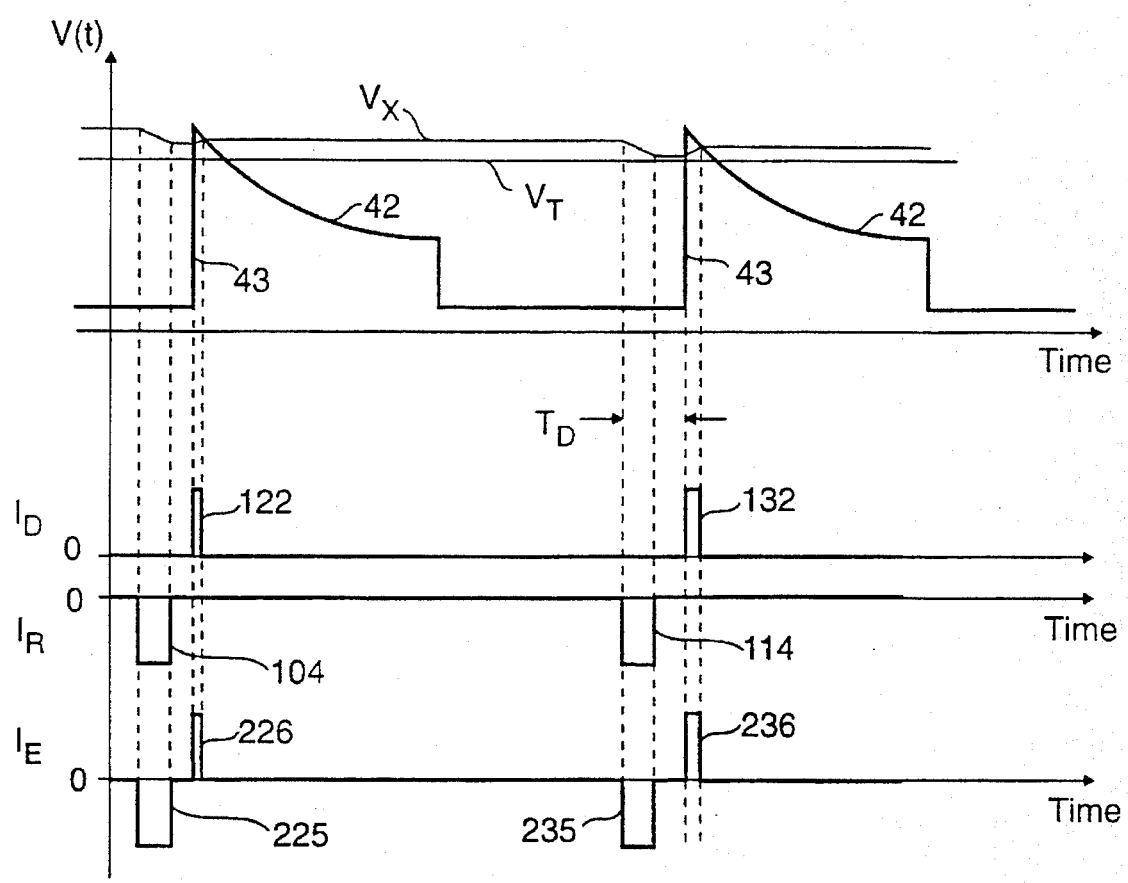

FIGS. 13(a) and 13(b) are timing diagrams which illustrate the operation of the level detector circuit of FIG. 10 with a reference pulse arriving before the rising edge 43 of the reflected pulse 42. The $I_R$ pulses 104, 114 and $I_D$ pulses 102, 112, 142 and 152 are substantially unchanged from FIG. 11, with the exception of the arrival time of IR pulses 104, 114, with respect to the reflected pulse rising edge 43. The operation of the level detector circuit is similar to that described above in conjunction with FIG. 11. However, the $I_E$ current signal in FIG. 13(a) includes both a negative error pulse 205 and a positive error pulse 206, rather than the single error pulse 106 in FIG. 11(a). The duration of the positive pulse 206 is longer than that of the negative pulse 205, so there is a net charging of the detector output voltage $V_X$ toward the desired voltage threshold $V_T$. A similar but smaller net charging toward the positive voltage threshold occurs during the next reflected write pulse, since positive error pulse 216 is still longer than negative pulse 215.

Figure 13C:
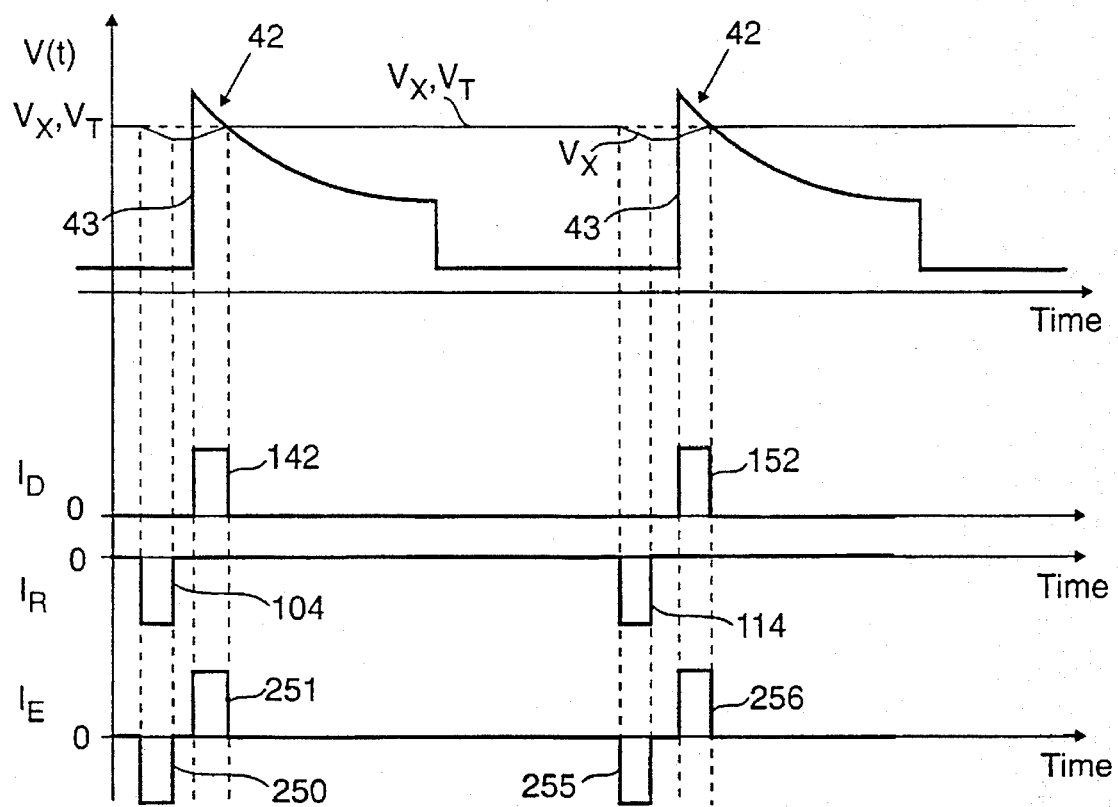

In FIG. 13(b), the detector output voltage moves down toward the desired voltage threshold, as in FIG. 11(b), despite the early arrival of the $I_R$ reference pulses 104, 114. The positive error pulses 226, 236 are shorter than the negative error pulses 225, 235, and therefore there is a net charging toward the negative voltage reference, and the detector output voltage $V_X$ decreases toward the desired threshold $V_T$. In FIG. 13(c), as in FIG. 11(c), the output voltage $V_X$ is maintained at the detector threshold voltage $V_T$. The negative error pulses 250, 255 are the same duration as the positive error pulses 251, 256, so there is no net change in the detector output voltage. As can be seen in FIG. 13, the operation of the level detectors in the MFE signal generator of the present invention is substantially unchanged even if the reference pulses arrive before the reflected pulse rising edge. As noted in conjunction with FIG. 12(c), the level detectors are similarly insensitive to late arrival of reference pulses.

Figure 14A:
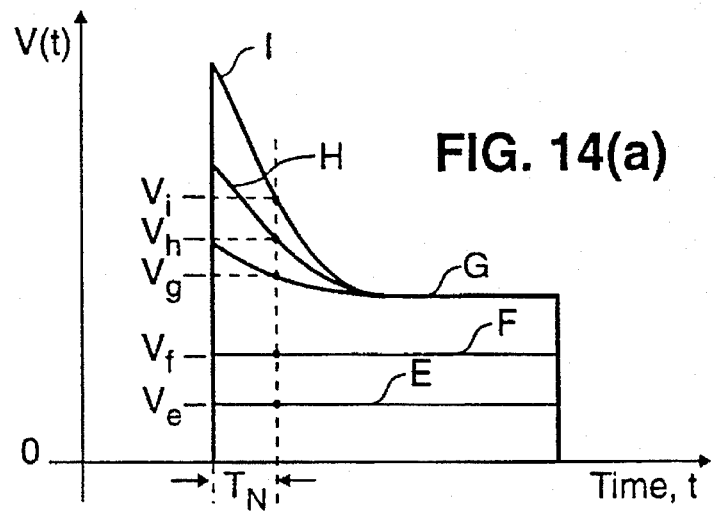
FIGS. 14(a) to 14(d) illustrate an embodiment of the present invention which utilizes an integration of the reflected write pulse as an MFE signal.
Figure 14B:
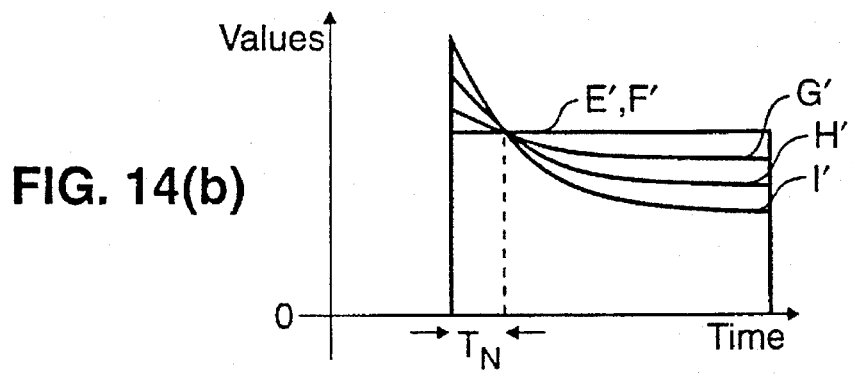
Figure 14C:
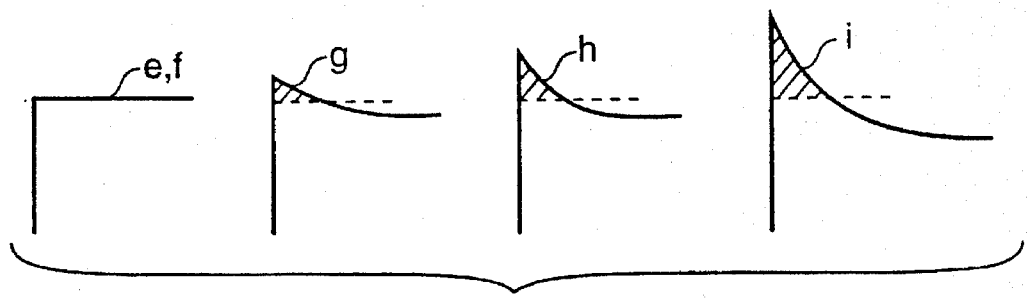
Figure 14D:
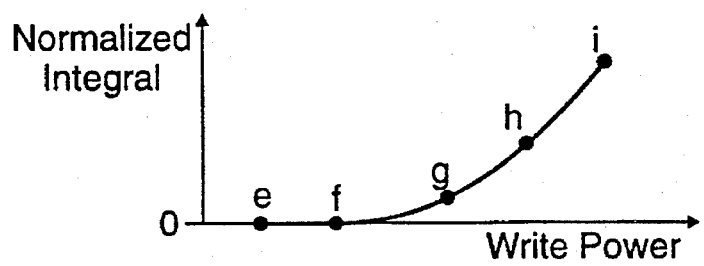

An alternative MFE signal suitable for use in the present invention is an integral of the area under the reflected pulse from the pulse rising edge 43 to a predetermined time after the rising edge, normalized to a measured point on the waveform. FIG. 14(a) illustrates several exemplary superimposed reflected write pulses E, F, G, H and I, each corresponding to a different incident power level. For illustrative purposes, only the portions of the pulses above a read level, corresponding to the lower level 47 in FIG. 2(c), are shown. The reflected write pulses E', F', G', H' and I' shown in FIG. 14(b) are obtained by dividing the pulses in FIG. 14(a) by their respective voltages at a time $T_N$. The time $T_N$ also represents the predetermined time after the rising edge up to which the area under the normalized reflected pulse is integrated. FIG. 14(c) shows the areas under the reflected pulses for pulses G, H, and I, while the pulses E and F are both essentially flat-top pulses with decay rates and areas of zero. The normalization to a reflected pulse voltage at time $T_N$ provides advantages similar to those provided by the ratio $V_1/V_2$ described above. For example, the normalized area is independent of absolute pulse magnitude, and instead depends only on the pulse shape. The normalized areas shown in FIG. 14(c) are plotted in FIG. 14(d), and exhibit measurable variation with reflected pulse decay rate. The normalized integral of the reflected signal voltage may thus be used as an MFE signal in accordance with the present invention, to indicate normalized reflected pulse decay rate. A level detector such as that shown in FIG. 10 may be used to determine a threshold voltage which the reflected pulses exceed for the time $T_N$.

Although the foregoing detailed description has described the present invention primarily in terms of an illustrative optical recording system and method, it should be understood that the embodiments discussed are exemplary only. Many variations may be made in the arrangements shown, including, for example, the rate of change measurement techniques, the rate of change detection and normalization circuitry, the type of optical recording medium, and the shape, sign and duration of the reflected pulse rate of change. These and other alternatives and variations will be readily apparent to those skilled in the art, and the present invention is therefore limited only by the appended claims.

| PARTS LIST | |
|---|---|
| 10 | optical head |
| 11 | optical source |
| 12 | beam shaping optics |
| 13 | beam splitter |
| 14 | optical medium |
| 15 | focusing lens |
| 16 | actuator |
| 18 | beam splitter |
| 19 | optical detector |
| 20 | photodetector |
| 21 | photodetector |
| 22 | signal combiner |
| 23 | MFE signal generator |
| 24 | recording system memory |
| 25 | comparison means |
| 26 | recording system processor |
| 27 | pulse generator |
| 28 | data source |
| 30 | incident write pulse |
| 31 | write power level |
| 32 | write signal intervals |
| 33 | lower power level |
| 34 | high reflectivity value |
| 35 | low reflectivity value |
| 40 | incident write pulse rising edge |
| 42 | reflected write pulse |
| 43 | reflected write pulse rising edge |
| 44 | reflected write pulse peak voltage |
| 46 | reflected write pulse plateau voltage |
| 50 | reflected write signal input |
| 51 | level detector reflected signal input |
| 52 | first level detector |
| 54 | second level detector |
| 56 | reference pulse input |
| 58 | reference pulse input |
| 60 | normalizer circuit |
| 62 | normalizer circuit output |
| 64 | peaking circuit |
| 65 | op-amp |
| 70 | comparator |
| 71 | signal line |
| 72 | first current switch |
| 74 | first current source |
| 76 | positive voltage reference |
| 78 | circuit output node |
| 80 | detector output capacitor |
| 82 | second current switch |
| 84 | second current source |
| 86 | negative voltage reference |
| 90 | buffer amplifier |
| 92 | floor circuit |
| 94 | bipolar transistor |
| 102, 112, 122, 132, 142, 152 | $I_D$ current pulses |
| 104, 114 | $I_R$ current pulses |
| 106, 116, 126, 136 | $I_E$ current pulses |
| 108, 118 | $V_X$ increasing portions |
| 205, 215, 225, 235, 250, 255 | negative $I_E$ current pulses |
| 206, 216, 226, 236, 251, 256 | positive $I_E$ current pulses |
| A, B, C, D, E F, G, H, I | reflected write pulses |
| A', B', C', D', E' F', G', H', I' | reflected write pulses in unitless values |

-continued

PARTS LIST

| | |
|---|---|
| a, b, c, d, e, f, g, h, i | MFE signals |
| C1, C2, C3 | reflected write pulses |
| $C_P$ | capacitor |
| $I_D$ | detector current signal |
| $I_R$ | reference current signal |
| $\Delta T_1$ | first predetermined time |
| $\Delta T_2$ | second predetermined time |
| $\Delta T_X$ | predetermined time |
| P | power |
| $P_I(t)$ | incident optical write signal |
| P1 | first switch position |
| P2 | second switch position |
| R | reflectivity |
| R(t) | reflectivity waveform |
| $R_1, R_2$ | input resistors |
| $R_F$ | feedback resistor |
| $R_P$ | parallel combination resistance |
| t, T | time |
| $T_N$ | reflected pulse measurement time |
| $T_D$ | reference pulse delay time |
| V | voltage |
| $V_1, V_{1a}, V_{1b}, V_{1c}, V_{1d}$ | first reflected pulse voltage |
| $V_2, V_{2a}, V_{2b}, V_{2a}, V_{2d}$ | second reflected pulse voltage |
| $V_P(t)$ | reflected pulse voltage |
| $V_R(t)$ | reflected write signal |
| $V_T$ | threshold voltage |
| $V_X$ | detector output voltage |
| X | exponential function time constant |
| $Y_1$ | plateau voltage |
| $Y_2$ | peak to plateau voltage difference |

What is claimed is:

1. A level detector for detecting a voltage level of a signal, comprising:

signal comparing means having a first input for receiving said signal;

a first switch responsive to an output of said signal comparing means to connect a first current source to an output of said detector, said first current source connected between a first voltage reference and said first switch, said detector output feeding back to a second input of said signal comparing means, such that said first current source supplies current to said detector output until a voltage at said detector output is greater than said voltage level of said signal;

a reference pulse input for receiving a reference pulse having a predetermined time duration;

a second switch responsive to said reference pulse to connect a second current source to said detector output, said second current source connected between a second voltage reference and said second switch, such that said second current source supplies current to said detector output for a period of time substantially equivalent to said predetermined reference pulse duration; and energy storage means connected between said detector output and a constant voltage potential of said detector, such that said output voltage of said detector varies in response to current supplied to said detector output from said first and said second current sources.

2. The level detector of claims 1 further including a buffer amplifier connected between said detector output and said second input of said signal comparing means.

3. The level detector of claim 1 further including a floor circuit connected between said detector output and said first voltage reference for setting a minimum value for said detector output voltage.

* * * * *